(12) United States Patent
Hung et al.

(10) Patent No.: US 11,302,600 B2
(45) Date of Patent: Apr. 12, 2022

(54) SEMICONDUCTOR DEVICE AND MANUFACTURING METHOD THEREOF

(71) Applicant: Taiwan Semiconductor Manufacturing Co., Ltd., Hsinchu (TW)

(72) Inventors: Wensen Hung, Hsinchu County (TW); Ping-Kang Huang, Chiayi (TW); Sao-Ling Chiu, Hsinchu (TW); Tsung-Shu Lin, New Taipei (TW); Tsung-Yu Chen, Hsinchu (TW); Chien-Yuan Huang, Hsinchu (TW); Chen-Hsiang Lao, New Taipei (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 13 days.

(21) Appl. No.: 16/718,211

(22) Filed: Dec. 18, 2019

(65) Prior Publication Data
US 2021/0193550 A1    Jun. 24, 2021

(51) Int. Cl.
*H01L 23/367* (2006.01)
*H01L 21/48* (2006.01)
*H01L 25/065* (2006.01)
*H01L 25/00* (2006.01)
*H01L 23/42* (2006.01)

(52) U.S. Cl.
CPC ...... *H01L 23/3675* (2013.01); *H01L 21/4882* (2013.01); *H01L 25/0652* (2013.01); *H01L 25/50* (2013.01); *H01L 21/4871* (2013.01); *H01L 23/42* (2013.01); *H01L 2225/06513* (2013.01); *H01L 2225/06541* (2013.01); *H01L 2225/06586* (2013.01); *H01L 2225/06589* (2013.01)

(58) Field of Classification Search
CPC . H01L 23/3675; H01L 25/50; H01L 21/4882; H01L 25/0652; H01L 2225/06541; H01L 2225/06513; H01L 2225/06589; H01L 2225/06586; H01L 21/4871; H01L 23/42
See application file for complete search history.

(56) References Cited

U.S. PATENT DOCUMENTS

| | | |
|---|---|---|
| 8,993,380 B2 | 3/2015 | Hou et al. |
| 9,281,254 B2 | 3/2016 | Yu et al. |
| 9,299,649 B2 | 3/2016 | Chiu et al. |
| 9,372,206 B2 | 6/2016 | Wu et al. |
| 9,425,126 B2 | 8/2016 | Kuo et al. |
| 9,443,783 B2 | 9/2016 | Lin et al. |

(Continued)

*Primary Examiner* — Patricia D Valenzuela
(74) *Attorney, Agent, or Firm* — JCIPRNET

(57) ABSTRACT

A semiconductor device includes a circuit substrate, a semiconductor package, and a metallic cover. The semiconductor package is disposed on the circuit substrate. The metallic cover is disposed over the semiconductor package and over the circuit substrate. The metallic cover comprises a lid and outer flanges. The lid overlies the semiconductor package. The outer flanges are disposed at edges of the lid, are connected with the lid, extend from the lid towards the circuit substrate, and face side surfaces of the semiconductor package. The lid has a first region that is located over the semiconductor package and is thicker than a second region that is located outside a footprint of the semiconductor package.

19 Claims, 31 Drawing Sheets

SD80

(56) References Cited

U.S. PATENT DOCUMENTS

| | | | |
|---|---|---|---|
| 9,461,018 B1 | 10/2016 | Tsai et al. | |
| 9,496,189 B2 | 11/2016 | Yu et al. | |
| 9,666,502 B2 | 5/2017 | Chen et al. | |
| 9,735,131 B2 | 8/2017 | Su et al. | |
| 2005/0046001 A1* | 3/2005 | Warner | H01L 23/645 257/678 |
| 2007/0148821 A1* | 6/2007 | Do | H01L 25/0657 438/109 |
| 2010/0013089 A1* | 1/2010 | So | H01L 23/3675 257/712 |
| 2013/0292826 A1* | 11/2013 | Lin | H01L 23/5384 257/737 |
| 2018/0331011 A1* | 11/2018 | Rivera | H01L 23/3675 |

* cited by examiner

SEMICONDUCTOR DEVICE AND MANUFACTURING METHOD THEREOF

BACKGROUND

Semiconductor devices and integrated circuits used in a variety of electronic apparatus, such as cell phones and other mobile electronic equipment, are typically manufactured on a single semiconductor wafer. The dies of the wafer may be processed and packaged with other semiconductor devices or dies at the wafer level, and various technologies and applications have been developed for wafer level packaging. Integration of multiple semiconductor devices has become a challenge in the field. To respond to the increasing demand for miniaturization, higher speed, and better electrical performance (e.g., lower transmission loss and insertion loss), more creative packaging and assembling techniques are actively researched.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
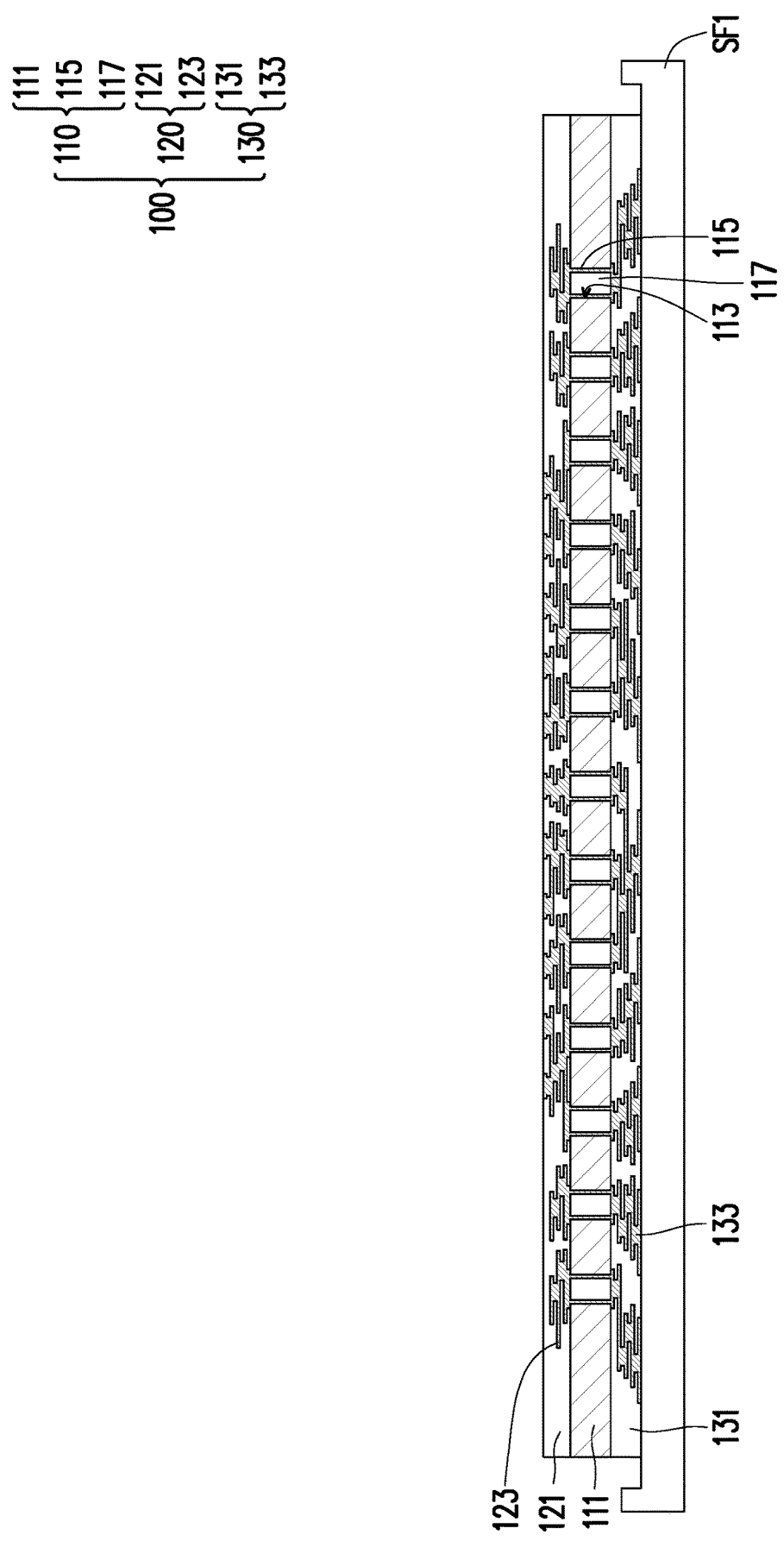
FIG. 1A to FIG. 1F are schematic cross-sectional views of structures produced at various stages of a manufacturing method of a semiconductor device according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1A through FIG. 1F are schematic cross-sectional views of structures produced at various stages of a manufacturing method of a semiconductor device SD10 according to some embodiments of the present disclosure. Referring to FIG. 1A, in some embodiments a circuit substrate 100 is disposed on a supporting frame SF1. In some embodiments, the circuit substrate 100 includes a core layer 110 and build-up layers 120, 130 disposed on opposite sides of the core layer 110. The core layer 110 may include a dielectric layer 111 having through holes 113 which cross the dielectric layer 111 from side to side. The through holes 113 may be lined with conductive material forming the through vias 115. In some embodiments, the through vias 115 only partially fill (e.g., line the edges of) the through holes 113, which are filled by a dielectric filling 117. In some alternative embodiments, the through holes 113 are filled by the through vias 115. In some embodiments, each build-up layer 120 or 130 respectively includes a dielectric layer 121 or 131 and conductive patterns 123 or 133 embedded in the corresponding dielectric layer 121 or 131 and providing electrical connection between opposite sides of the corresponding dielectric layer 121 or 131. In some embodiments, the build-up layers 120, 130 may independently include more or fewer dielectric layers 121, 131 and conductive patterns 123, 133 than what is illustrated in FIG. 1A, according to the routing requirements. In some embodiments, the through vias 115 establish electrical connection between the conductive patterns 123 of one build-up layer 120 with the conductive patterns 133 of the other build-up layer 130. In some embodiments, the circuit substrate 100 is disposed on the supporting frame SF1 with the build-up layer 130 directed towards the supporting frame SF1, and the other build-up layer 120 exposed for further processing.

Figure 1B:
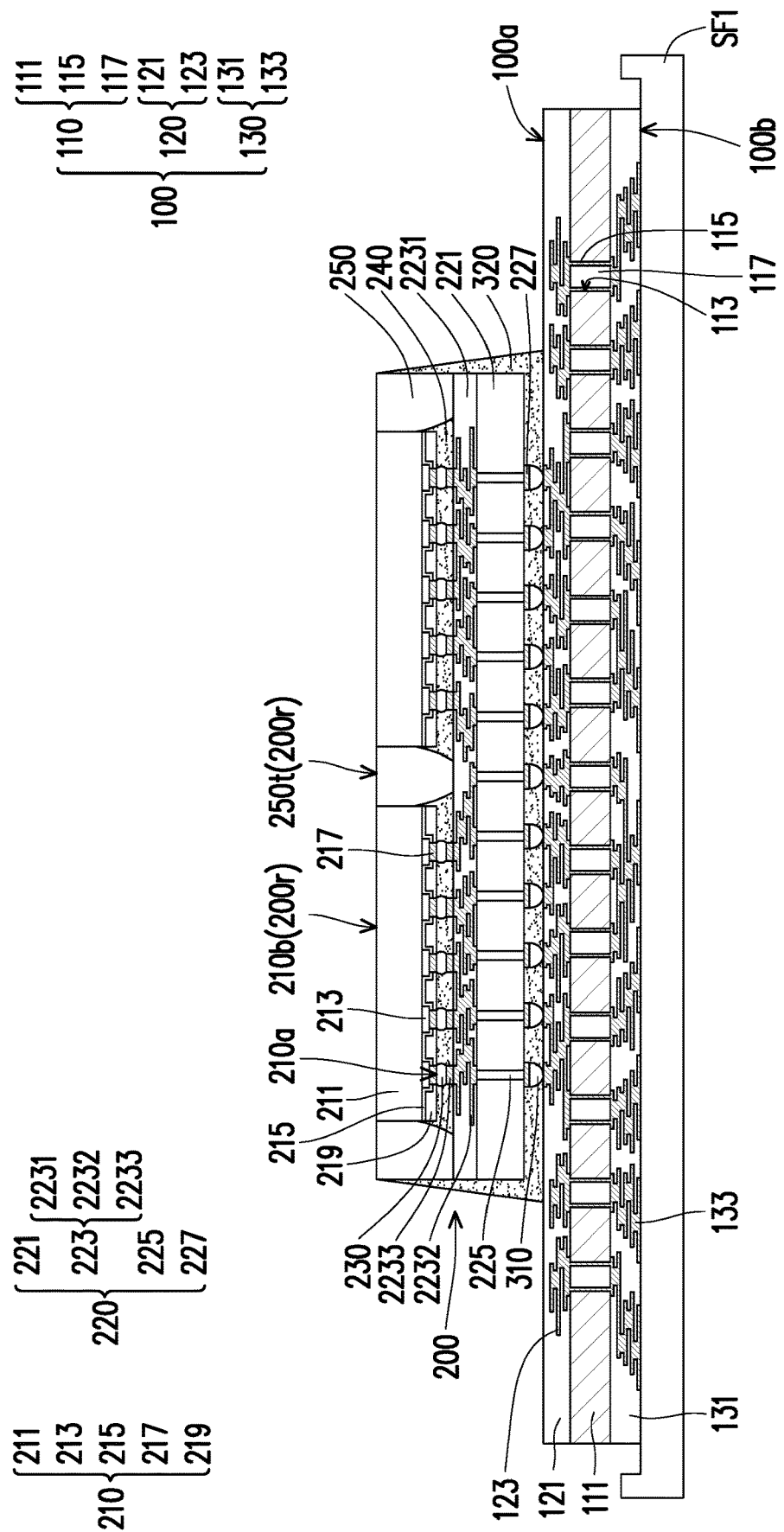

Referring to FIG. 1B, in some embodiments a semiconductor package 200 is connected to an exposed side 100a of the circuit substrate 100 (e.g., the side of the build-up layer 120), while an opposite side 100b of the circuit substrate 100 is directed towards the supporting frame SF1. In some embodiments, the semiconductor package 200 includes one or more chips 210. In some embodiments, each chip 210 includes a semiconductor substrate 211, contact pads 213 and a passivation layer 215. The contact pads 213 may be formed on a top surface of the semiconductor substrate 211. The passivation layer 215 may cover the top surface of the semiconductor substrate 211 and have a plurality of openings that exposes at least a portion of each contact pad 213. In some embodiments, a chip 210 may further include a plurality of contact posts 217 filling the openings of the passivation layer 215 and electrically connected to the contact pads 213, and a protective layer 219 surrounding the contact posts 217.

In some embodiments, the semiconductor substrate 211 may be made of semiconductor materials, such as semiconductor materials of the groups III-V of the periodic table. In some embodiments, the semiconductor substrate 211 includes active components (e.g., transistors or the like) and optionally passive components (e.g., resistors, capacitors, inductors, or the like) formed therein. In certain embodiments, the contact pads 213 include aluminum pads, copper pads, or other suitable metal pads. In some embodiments, the passivation layer 215 may be a single layer or a multi-layered structure, including a silicon oxide layer, a silicon nitride layer, a silicon oxy-nitride layer, a dielectric layer formed by other suitable dielectric materials, or combinations thereof. In some embodiments, the material of the contact posts 217 includes copper, copper alloys, or other conductive materials, and may be formed by deposition, plating, or other suitable techniques. In some embodiments, any chip 210 of the semiconductor package 200 may present similar features as the ones just discussed.

Each chip 210 may independently be or include a logic die, such as a central processing unit (CPU) die, a graphic processing unit (GPU) die, a micro control unit (MCU) die, an input-output (I/O) die, a baseband (BB) die, or an application processor (AP) die. In some embodiments, one or more chips 210 may be memory dies. The disclosure is not limited by the type of chips 210 included in the semiconductor package 200.

Referring to FIG. 1B, in some embodiments, the chips 210 are bonded to an interposer 220. In some embodiments, the interposer 220 includes a semiconductor substrate 221, an interconnection structure 223, through semiconductor vias (TSVs) 225, and contact pads 227. The semiconductor substrate 221 is made of a semiconductor material, similarly to what was previously discussed with reference to the semiconductor substrate 211 of the chips 210. In some embodiments, the interposer 220 includes a silicon wafer. In some embodiments, the interconnection structure 223 is disposed on the semiconductor substrate 221 and includes a dielectric layer 2231, conductive patterns 2232 and under-bump metallurgies 2233. For simplicity, the dielectric layer 2231 is illustrated as a single dielectric layer and the conductive patterns 2232 are illustrated as embedded in the dielectric layer 2231. Nevertheless, from the perspective of the manufacturing process, the dielectric layer 2231 is constituted by at least two dielectric layers. The conductive patterns 2232 may be sandwiched between two adjacent dielectric layers. Some of the conductive patterns 2232 may extend vertically through the dielectric layer 2231 to establish electrical connection between different metallization tiers of the interconnection structure 223. In some embodiments, the (outermost) dielectric layer 2231 may be patterned to expose the underlying conductive patterns 2232. The under-bump metallurgies 2233 may optionally be conformally formed in the openings of the (outermost) dielectric layer 2231 exposing the conductive patterns 2232 and may further extend over portions of the exposed surface of the (outermost) dielectric layer 2231. In some embodiments, the under-bump metallurgies 2233 include multiple stacked layers. For example, the under-bump metallurgies 2233 may include one or more metallic layers stacked on a seed layer. In some embodiments, the material of the dielectric layer 2231 includes polyimide, epoxy resin, acrylic resin, phenol resin, benzocyclobutene (BCB), polybenzooxazole (PBO), or any other suitable polymer-based dielectric material. The dielectric layer 2231, for example, may be formed by suitable fabrication techniques such as spin-on coating, chemical vapor deposition (CVD), plasma-enhanced chemical vapor deposition (PECVD), or the like. In some embodiments, materials of the conductive patterns 2232 and the under-bump metallurgies 2233 include aluminum, titanium, copper, nickel, tungsten, or alloys thereof. The conductive patterns 2232 and the under-bump metallurgies 2233 may be formed by, for example, electroplating, deposition, and/or photolithography and etching. It should be noted that the number of the dielectric layers 2231, the number of the conductive patterns 2232, and the number of under-bump metallurgies 2233 illustrated in FIG. 1B are merely for illustrative purposes, and the disclosure is not limited thereto. In some alternative embodiments, fewer or more layers of the dielectric layers 2231, conductive patterns 2232 or under-bump metallurgies 2233 may be formed depending on the circuit design.

In some embodiments, as illustrated in FIG. 1B, the TSVs 225 are formed in the semiconductor substrate 221, and provide dual-side electrical connection through the semiconductor substrate 221. In some embodiments, one end of a TSV 225 is connected to the conductive patterns 2232 of the interconnection structure 223 and the other end of the same TSV 225 is connected to a contact pad 227 formed on a side of the semiconductor substrate 221 opposite to the interconnection structure 223. In some embodiments, a material of the TSVs 225 includes one or more metals. In some embodiments, the metal material of the TSVs 225 includes copper, titanium, tungsten, aluminum, combinations thereof, or the like.

In some embodiments, the chips 210 are bonded via connectors 230 to the interposer 220. In some embodiments, the connectors 230 are micro-bumps installed on the contact posts 217 and sandwiched between the contact posts 217 and the under-bump metallurgies 2233 or the TSVs 225 (if no interconnection structure 223 is included in the interposer 220). According to some embodiments, the chips 210 are disposed with the active surfaces 210a (the surfaces exposing the contact posts 217 or the contact pads 213 when no contact posts 217 are included) facing the interposer 220.

In some embodiments, an underfill 240 may be disposed between the chips 210 and the interposer 220 to protect the connectors 230 against thermal or physical stresses and secure the electrical connection of the chips 210 to the interposer 220. In some embodiments, the underfill 240 is formed by capillary underfill filling (CUF). In some embodiments, as shown in FIG. 1B, multiple underfill portions 240 are formed, each portion securing the connectors 230 of a chip 210. In some alternative embodiments, a single common underfill (not shown) may extend below the chips 210, depending on the spacing and relative positions of the chips over the interposer 220. Referring to FIG. 1B, an encapsulant 250 is formed over the interposer 220 wrapping the chips 210 and the underfills 240. In some embodiments, the encapsulant 250 may include a molding compound, a molding underfill, a resin (such as an epoxy resin), or the like. In some embodiments, the encapsulant 250 is formed by an over-molding process. In some embodiments, the encapsulant 250 may leave exposed the backside surfaces 210b of the chips 210. That is, a top surface 250t of the encapsulant and the backside surfaces 210b of the chips 210 may constitute a rear surface 200r of the semiconductor package 200.

In some embodiments, conductive terminals 310 are disposed between the contact pads 227 of the semiconductor package 200 and the portions of the conductive patterns 123 of the build-up layer 120 exposed by the (outermost) dielectric layer 121. In some embodiments, the conductive terminals 310 are C4-bumps. In some embodiments, an underfill 320 is disposed between the semiconductor package 200 and the circuit substrate 100 to protect the conductive terminals 310 from thermal and mechanical stresses.

In FIG. 1B only two chips 210 are shown on the interposer 220 for simplicity, but the disclosure is not limited thereto. In some embodiments, the semiconductor package 200 may include more or fewer chips 210 than what is illustrated in FIG. 1B, as well as other components (e.g., dummy dies, stress release layers, interconnect structures, support pillars, etc.). Furthermore, whilst the process is currently being illustrated for a Chip-on-Wafer—(CoW) package 200, the disclosure is not limited to the package structure shown in the drawings, and other types of semiconductor package such as integrated fan-out (InFO) packages, package-on-packages (PoP), etc., are also meant to be covered by the present disclosure and to fall within the scope of the appended claims.

Figure 1C:
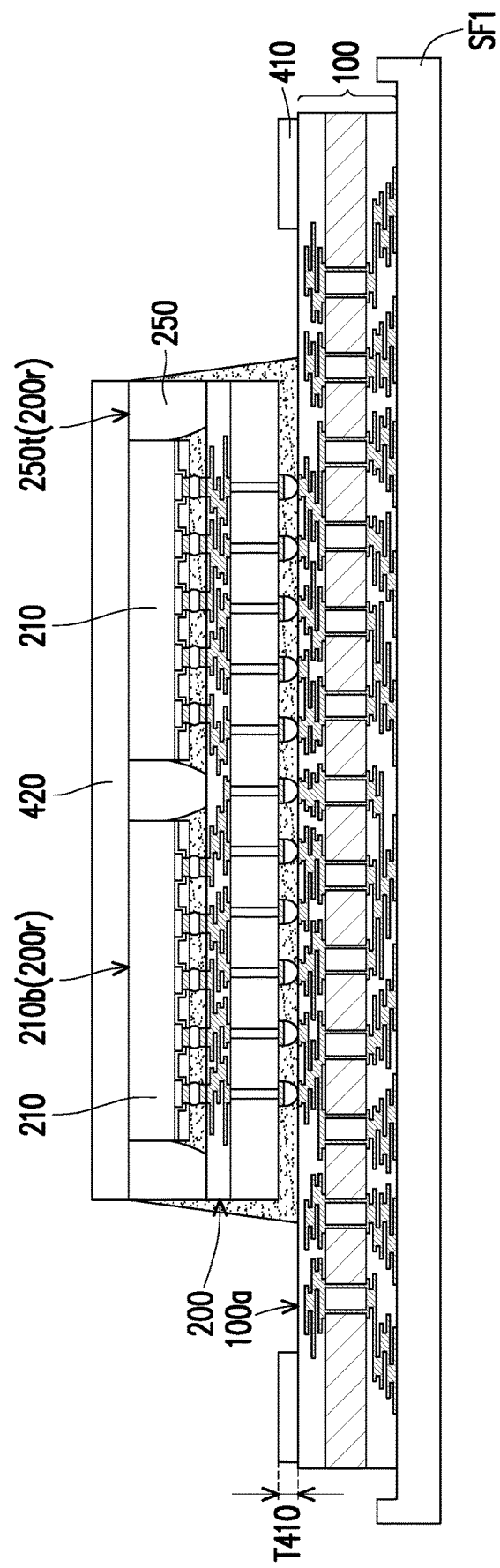

Referring to FIG. 1C, in some embodiments, an adhesive 410 is disposed on the side 100a of the circuit substrate 100, along the outer periphery of the circuit substrate 100. In some embodiments, the adhesive 410 forms a frame following the profile of the outer periphery of the circuit substrate 100. For example, if the circuit substrate 100 has a rectangular footprint, the adhesive 410 may have the shape of a rectangular frame. Similarly, if the circuit substrate 100 has a circular footprint, the adhesive 410 may have the shape of a circular frame. In some embodiments, multiple portions of adhesive 410 are disposed on the circuit substrate 100. That is, the frame formed by the adhesive 410 may be discontinuous, presenting gaps in which the circuit substrate 100 is exposed in between consecutive portions of adhesive 410. In some embodiments, the adhesive 410 may have a thickness T410 in the range from 50 micrometers to 250 micrometers. In some embodiments, the adhesive 410 has an elongation in the range from 20% to 200%, for example around 50%. In some embodiments, the adhesive 410 has an elastic modulus in the range from 50 to 100 MPa. In some embodiments, the elastic modulus of the adhesive 410 is greater than 50 MPa and up to 100 MPa. In some embodiments, the adhesive 410 includes a thermocurable adhesive, a photocurable adhesive, a thermally conductive adhesive, a thermosetting resin, a waterproof adhesive, a lamination adhesive, or a combination thereof. In some embodiments, the adhesive 410 includes a thermally conductive adhesive. In some embodiments, the adhesive 410 includes a metallic layer (not shown) with solder paste (not shown) deposited thereon. According to the type of material used, the adhesive 410 may be formed by deposition, lamination, printing, plating, or any other suitable technique.

In some embodiments, a thermal interface material (TIM) 420 is disposed on the rear surface 200r of the semiconductor package 200, in contact with the backside surfaces 210b of the chips 210. In some embodiments, the TIM 420 further extends over the encapsulant 250. In some embodiments, the TIM 420 is an adhesive material. In some embodiments, the TIM 420 includes grease-based materials, phase change materials, gels, adhesives, polymeric, metallic materials, or a combination thereof. In some embodiments, the TIM 420 includes lead-tin based solder (PbSn), silver paste (Ag), gold, tin, gallium, indium, or other suitable thermally conductive materials. According to the type of material used, the TIM 420 may be formed by deposition, lamination, printing, plating, or any other suitable technique. In some embodiments, the TIM 420 is a gel type material. In some embodiments, the TIM 420 is a film type material (e.g., carbon nanotubes or graphite), a composite sheet or composite film type with conductive material such filler, powder or flake shape particles embedded or CNT or graphite or graphene or a combination thereof.

Figure 1D:
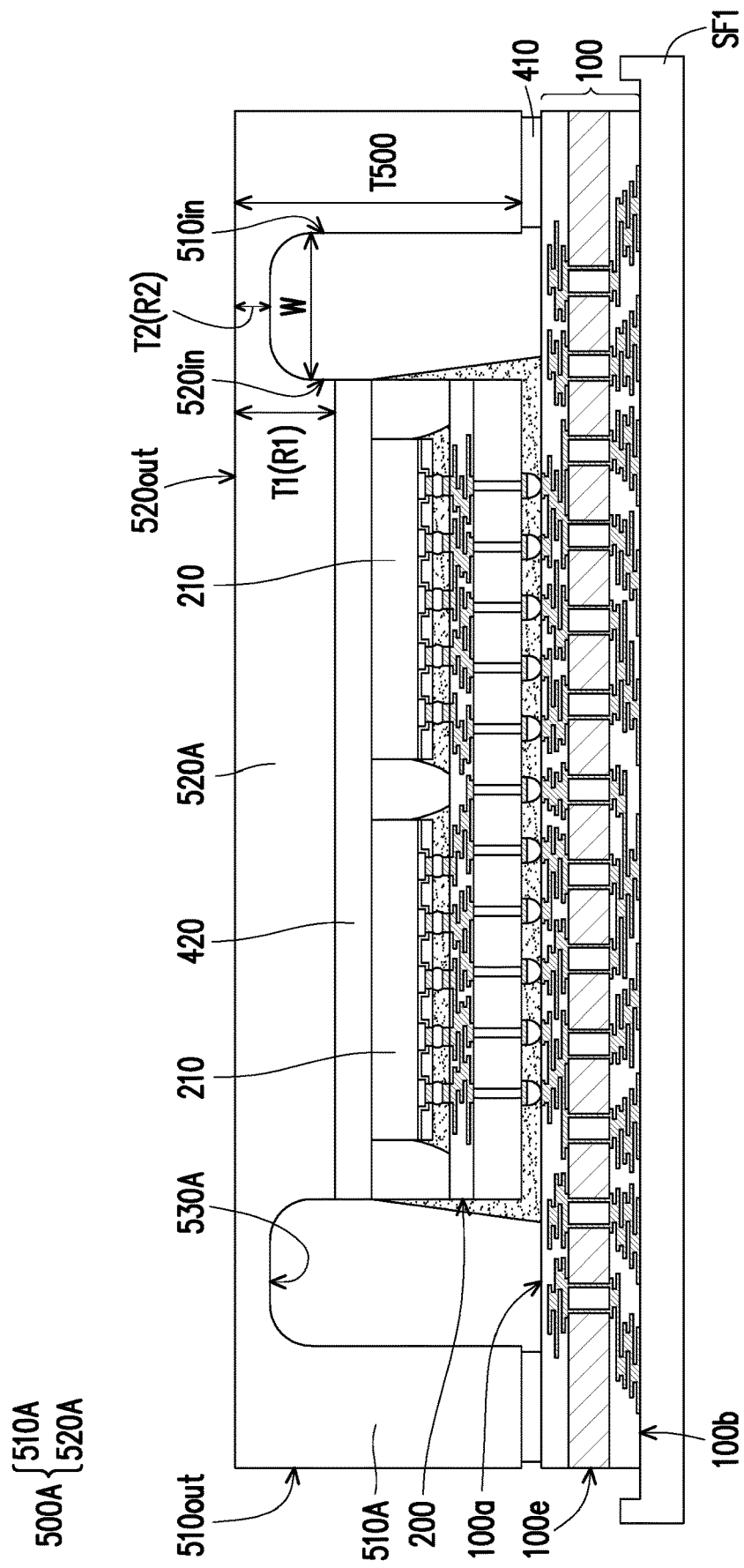

Referring to FIG. 1D, a metallic cover 500A is disposed on the circuit substrate 100. In some embodiments, the metallic cover 500A may be made of a conductive material. For example, the cover may include a metallic material, e.g., copper. In some embodiments, the metallic cover 500A may be subjected to an anodization or passivation treatment (e.g., with nickel) to enhance its environmental resistance before it is installed on the circuit substrate 100. In some embodiments, a footprint of the metallic cover 500A substantially matches and is aligned with the footprint of the circuit substrate 100. In some embodiments, the metallic cover 500A includes outer flanges 510A and a lid 520A. The outer flanges 510A may be disposed at the periphery of the lid 520A. In some embodiments, an outer edge 510out of the flanges 510A is vertically aligned with an outer edge 100e of the circuit substrate 100. In some embodiments, the outer edge 100e of the circuit substrate 100 corresponds to the peripheral surface joining the side 100a with the side 100b. In some embodiments, the lid 520A is disposed over the semiconductor package 200 in contact with the TIM 420 and extends substantially parallel to the circuit substrate 100. The outer flanges 510A may be located at the edge of the lid 520A, and project towards the circuit substrate 100. In some embodiments, the outer flanges 510A extend in a direction perpendicular to the plane defined by the lid 520A. In some embodiments, the outer flanges 510A and the lid 520A are integrally formed. That is, the outer flanges 510A and the lid 520A may be jointed to each other without a clear interface between the two. In some embodiments, the outer flanges 510A extend towards the circuit substrate 100 and surround the semiconductor package 200. In some embodiments, the outer flanges 510A, the lid 520A and the circuit substrate 100 define an enclosed space surrounding the semiconductor package 200 on all sides. That is, the semiconductor package 200 may be fully contained (enclosed) by the circuit substrate 100 and the metallic cover 500A. In some alternative embodiments, the outer flanges 510A do not entirely enclose the semiconductor package 200. That is, the outer flanges 510A may face only two opposite sides of the semiconductor package 200A, leaving the other sides exposed. In some embodiments, the outer flanges 510A reach the circuit substrate 100 where the adhesive 410 is disposed. The adhesive 410 may secure the outer flanges 510A to the circuit substrate 100, while the TIM 420 may secure the lid 520A to the semiconductor package 200. In some embodiments, the adhesive 410 is disposed on the circuit substrate 100 only where the outer flanges 510A are expected to contact the circuit substrate 100.

In some embodiments, a span of the lid 520A exceeds a span of the semiconductor package 200. In some embodiments, the span of the semiconductor package 200 may entirely fall within the span of the lid 520A. In some embodiments, the lid 520 may present regions of different thickness defining one or more grooves 530A. For example, as shown in FIG. 1D, the lid 520A may present a region R1 with a first thickness T1 when extending over the semiconductor package 200, and one or more regions R2 of reduced thickness (e.g., T2) when extending over the area of the circuit substrate 100 beside the semiconductor package 200. That is, the grooves 530A may be formed in an area of the metallic cover 500A adjacent to the region overlying the semiconductor package 200 (outside of a footprint of the semiconductor package 200), and may directly face the circuit substrate 100. That is, in some embodiments, a cavity or an air-filled gap may exist between the grooves 530A and the circuit substrate 100. In some embodiments, neither the semiconductor package 200 nor other elements are disposed in the cavity or air-filled gap, in between the region R2 of the lid 520A where the grooves 530A are formed and the circuit substrate 100. In some embodiments, the thickness of the lid 520A varies continuously from the thickness T1 (the thickness over the semiconductor package 200 and the TIM 420) to the thickness T2 (at the deepest point of the grooves 530A). In some embodiments, moving from the center of the circuit substrate 100 towards a peripheral edge, the lid 520A may present a region R1 of thickness T1 on the semiconductor package 200, a region of decreasing (continuously or stepwise), thickness until reaching the thickness T2 in the region R2 (the deepest point of the grooves 530A), and a region of increasing thickness (continuously or stepwise) until joining the outer flanges 510A. In some embodiments, the thickness T1 may be in the range from 0.5 mm to 3 mm. In some embodiments, the thickness T2 may be in the range from 0.2 mm to 1 mm. In some embodiments, a ratio of the thickness T2 to the thickness T1 may be in the range from 0.1 to 0.7. In some embodiments, a width W of a groove 530A may be measured as the distance between an inner surface 520in of the central part of the lid 520A (the portion of the lid 520A of thickness T1) and the inner surface 510in of the outer flanges 510A. That is, a groove 530A may extend from the edge of the semiconductor package 200 to the outer flanges 510A. In some embodiments, the width W of a groove 530A may be in the range from 2 mm to 10 mm. In some embodiments, the grooves 530A opens in the enclosure formed by the metallic cover 500A and the circuit substrate 100. That is, the grooves 530A may be formed at an inner surface 520in of the lid 520, while an outer surface 520out of the lid 520A may be substantially flat.

Figure 1E:
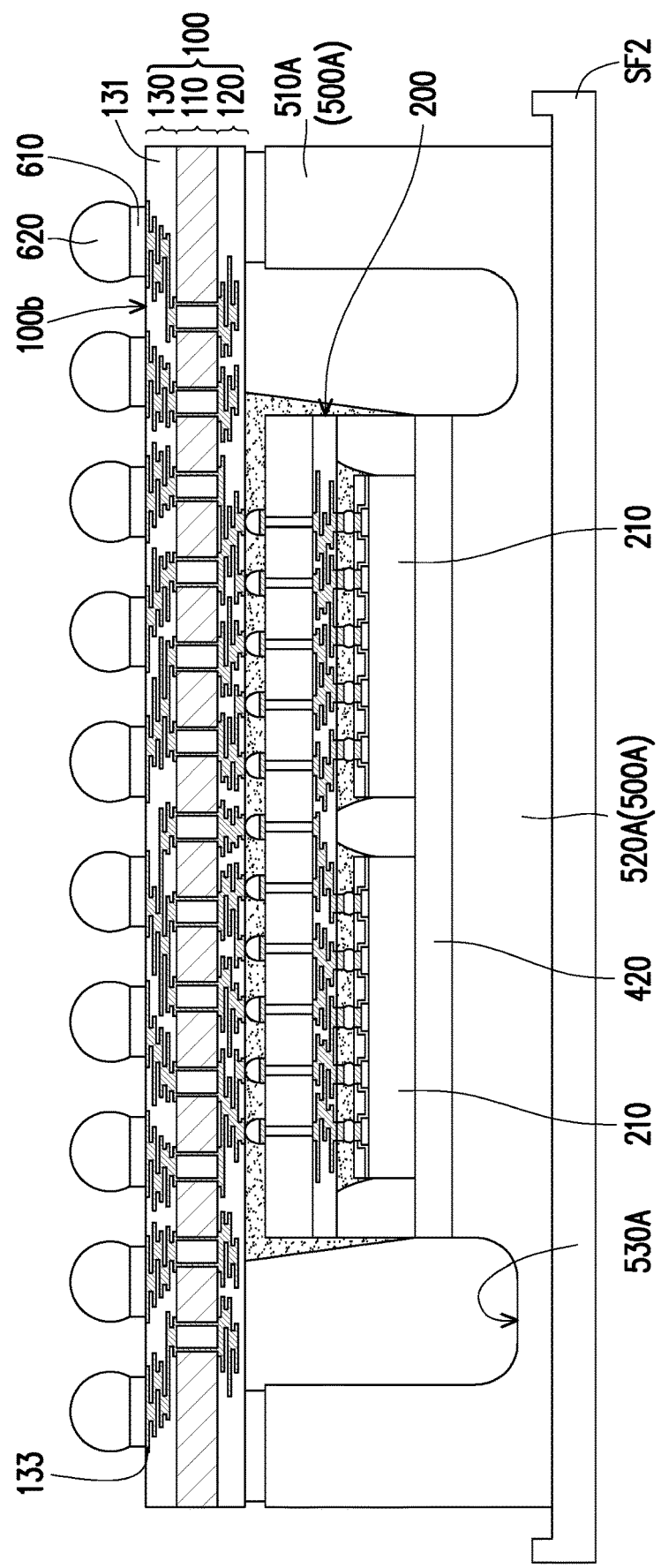

Referring to FIG. 1D and FIG. 1E, the structure shown in FIG. 1D may be overturned on a supporting frame SF2. In some embodiments, the metallic cover 500A may support the structure on the supporting frame SF2 to expose the build-up layer 130 of the circuit substrate 100 for further processing. That is, the side 100b may be exposed following overturning of the manufacturing intermediate. In some embodiments, the dielectric layer 131 may be patterned to expose portions of the conductive patterns 133 (if previously covered). In some embodiments, solder material 610 may be disposed on the build-up layer 130. In some embodiments, the solder material 610 is disposed on the openings of the dielectric layer 131 exposing the conductive patterns 133. In some embodiments, the solder material 610 includes eutectic solder containing lead or lead-free. In some embodiments, the solder material 610 includes non-eutectic solder. In some embodiments, the solder material 610 contains Sn, SnAg, SnPb, SnAgCu, SnAgZn, SnZn, SnBiIn, SnIn, SnAu, SnCu, SnZnIn, SnAgSb, or similar soldering alloys. In some embodiments, the solder material 610 is applied as a solder paste. In some embodiments, connective terminals 620 are provided on the solder material 610. In some embodiments, the connective terminals 620 are solder balls for ball grid array mounts. In some embodiments, the connective terminals 620 are electrically connected to the semiconductor package 200 via the circuit substrate 100.

Figure 1F:
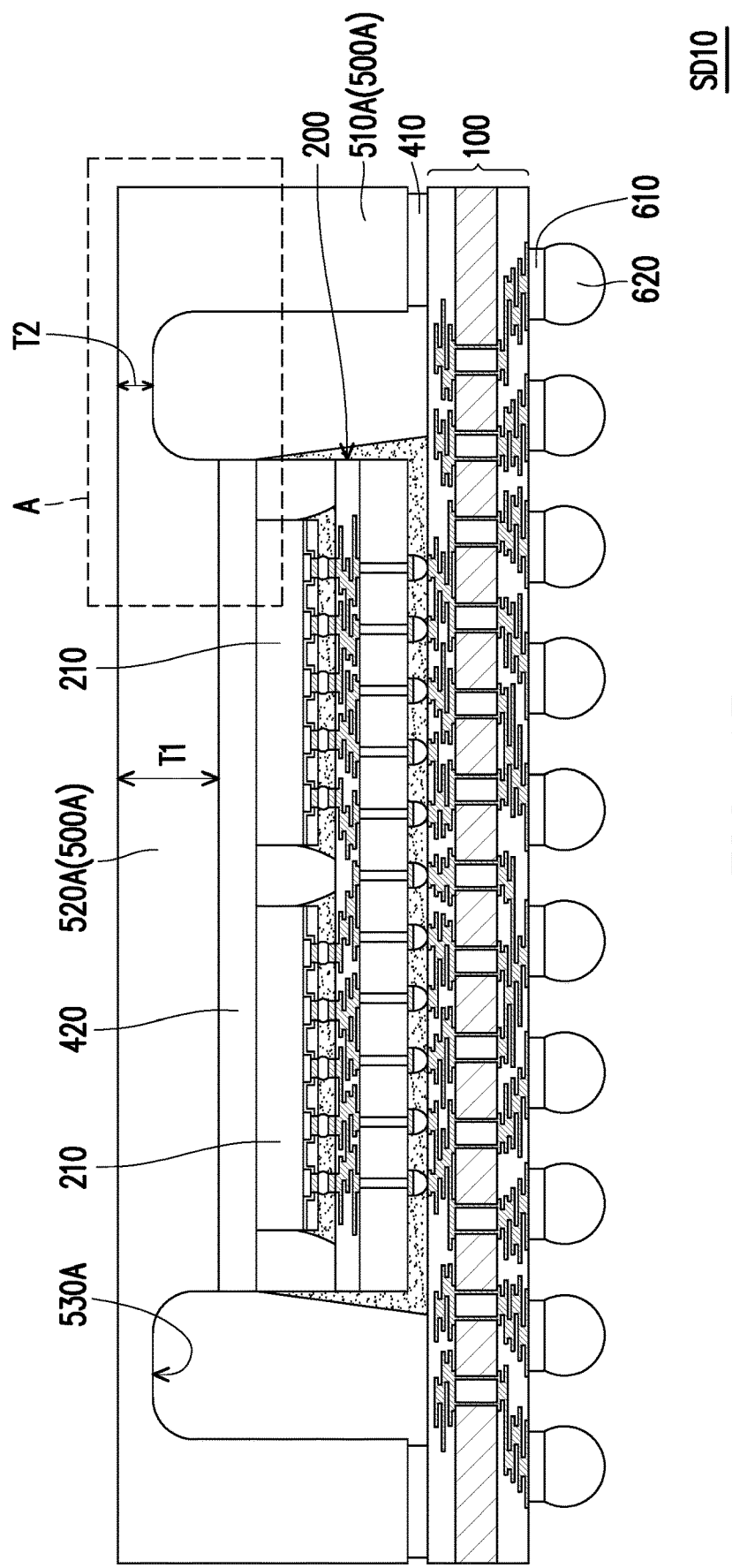
Figure 1G:
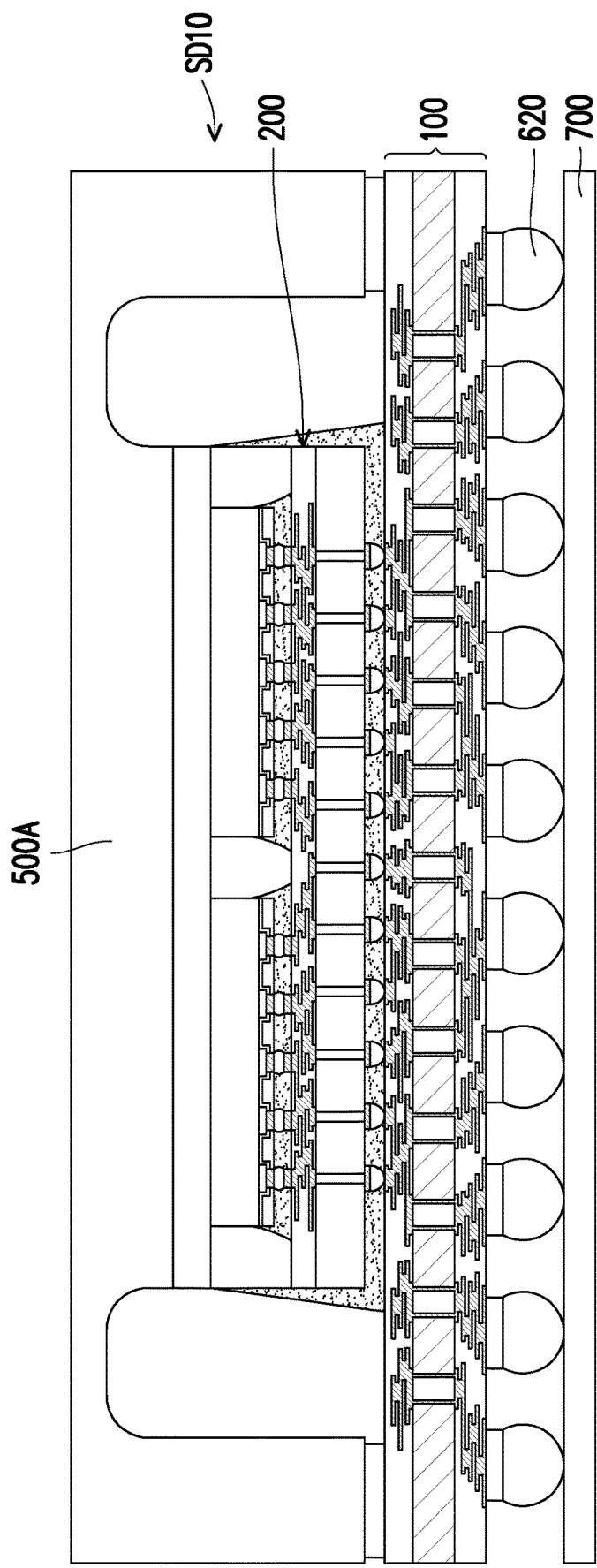
FIG. 1G is a schematic cross-sectional view of an electronic device according to some embodiments of the present disclosure.

Referring to FIG. 1E and FIG. 1F in some embodiments, the structure may be removed from the supporting frame SF2, and the semiconductor device SD10 may be subsequently obtained. In some embodiments, the semiconductor device SD10 includes a semiconductor package 200 connected to a circuit substrate 100, a metallic cover 500A disposed on the circuit substrate 100 surrounding the semiconductor package 200, and connective terminals 620 disposed on an opposite side of the circuit substrate 100 with respect to the semiconductor package 200 and the metallic cover 500A. In some embodiments, the metallic cover 500A may be secured within the semiconductor device SD10 by the adhesive 410 disposed on the circuit substrate 100, and by the TIM 420 disposed on the semiconductor package 200. In some embodiments, as illustrated in FIG. 1G, the semiconductor device SD10 may be integrated into larger electronic devices, for example by bonding the connective terminals 620 to a circuit carrier 700. In some embodiments, the circuit carrier 700 may be a printed circuit board, a mother board, or the like.

Figure 2A:
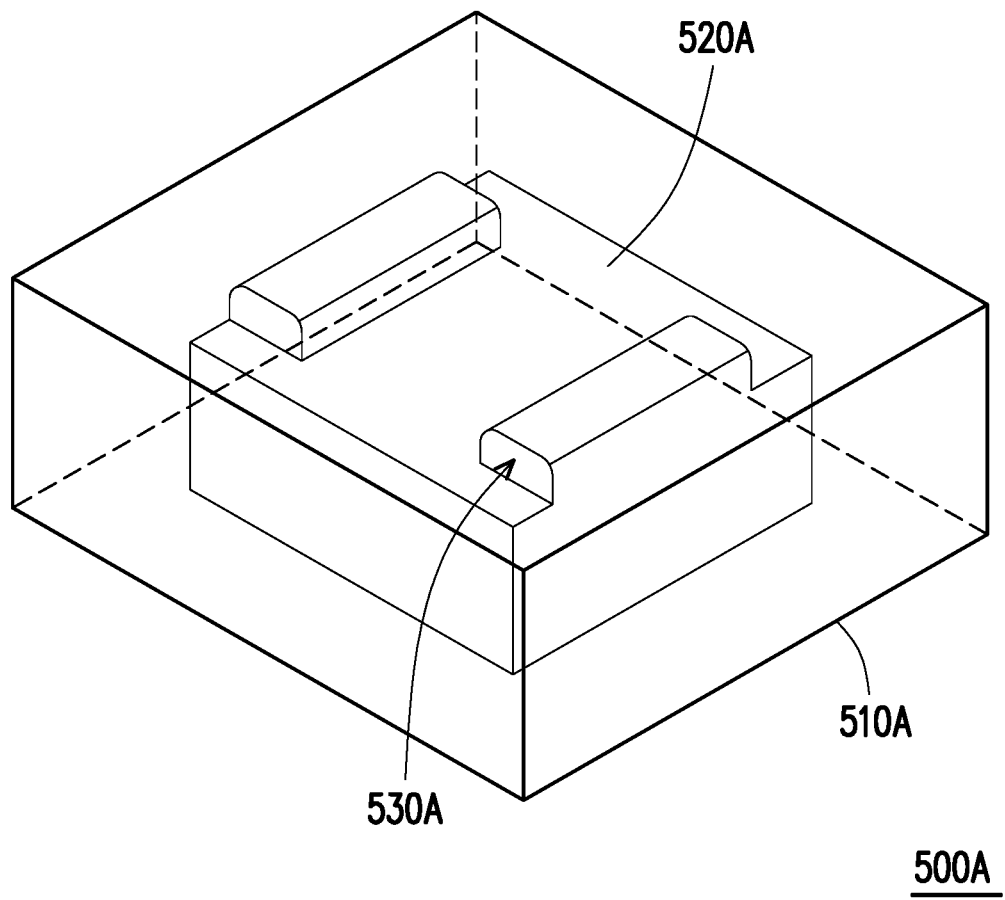
FIG. 2A is a schematic perspective view of a cover according to some embodiments of the present disclosure.
Figure 2B:
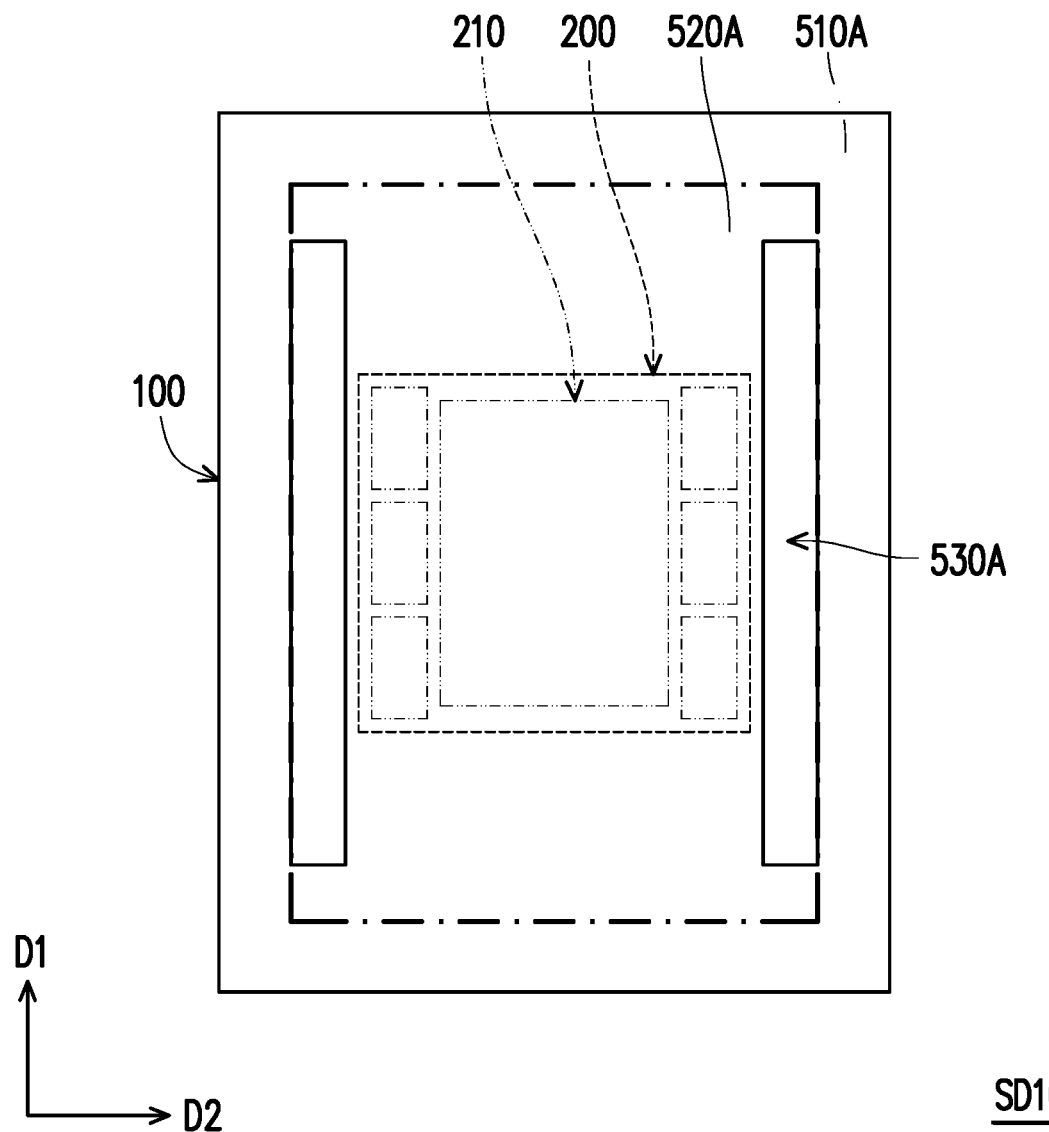
FIG. 2B to FIG. 2H are schematic top views of semiconductor devices according to some embodiments of the present disclosure.

FIG. 1F is a schematic cross-sectional view of the semiconductor device SD10 according to some embodiments of the disclosure. FIG. 2A is a perspective view of the metallic cover 500A according to some embodiments of the disclosure. FIG. 2B is a schematic top view of the semiconductor device SD10 according to some embodiments of the disclosure. In the top view of FIG. 2B, the outline of the outer flanges 510A is illustrated as a dash-dotted line, the outline of the semiconductor package 200 is illustrated as a dashed line, the outlines of the chips 210 is illustrated as dash-double dotted lines, and the outlines of the grooves 530A are illustrated by solid lines. In some embodiments, the grooves 530A may be formed along the 4 peripheral sides of the lid instead of 2 sides of the lid. Referring to FIG. 1F, FIG. 2A and FIG. 2B, in some embodiments, the metallic cover 500A includes the outer flanges 510A landing on the adhesive 410 and the lid 520A covering the semiconductor package 200. In some embodiments, the lid 520A has a thickness T1 in the area overlying the semiconductor package 200 and the TIM 420. In some embodiments, the area of the lid 520A having thickness T1 is in physical contact with the TIM 420. In some embodiments, heat generated during usage of the semiconductor device SD10 may be conveyed by the TIM 420 towards the metallic cover 500A, which may promote heat dissipation. In some embodiments, the lid 520A presents one or more regions of reduced thickness T2 at the sides of the semiconductor package 200. The thickness of the lid 520A may gradually and/or continuously change from the thickness T1 to the thickness T2, to then increase again where the lid 520A joints the outer flanges 510A. The thickness variation of the lid 520A may result in grooves 530A extending at the sides of the semiconductor package 200. In some embodiments, the grooves 530A extend along a pair of opposite side surfaces of the semiconductor package 200. For example, as illustrated in FIG. 2B, two grooves 530A are formed in the lid 520A, each one extending on a side of the semiconductor package 200. In some embodiments, the grooves 530A extend further than the adjacent side of the semiconductor package 200. That is, if the direction D1 is considered the direction in which the grooves 530A extend (the direction of the major dimension of the grooves 530A), the grooves 530A may be longer than (protrude with respect to) the adjacent side surface of the semiconductor package 200 in the direction D1. In some embodiments, considering a direction D2 perpendicular to the direction D1, the grooves 530A may extend from the side surface of the semiconductor package 200 to the outer flanges 510A. In some embodiments, the grooves 530A may reach the outer flanges 510A along the direction D2 and not along the direction D1, but the disclosure is not limited thereto. In some alternative embodiments, the grooves 530A may reach the outer flanges 510A also along the direction D1.

In some embodiments, including a lid 520A with grooves 530A formed therein at the sides of the semiconductor package 200 may reduce the deformation of the lid 520 under thermal or mechanical stress. In some embodiments, the grooves 530A may be capable of dissipating stress generated during manufacturing, usage, or testing (e.g. high temperature storage, unbiased highly accelerated stress testing, temperature cycling, etc.) of the semiconductor device SD10. In some embodiments, deformation of the lid 520A (and hence of the metallic cover 500A) may be alleviated, resulting in improved adhesion between the lid 520A and the TIM 420. In some embodiments, by forming grooves 530A in the lid 520A at the sides of the semiconductor package 200, delamination between the lid 520A and the TIM 420 may be reduced or prevented, thus enhancing the reliability of the semiconductor device SD10.

Figure 2C:
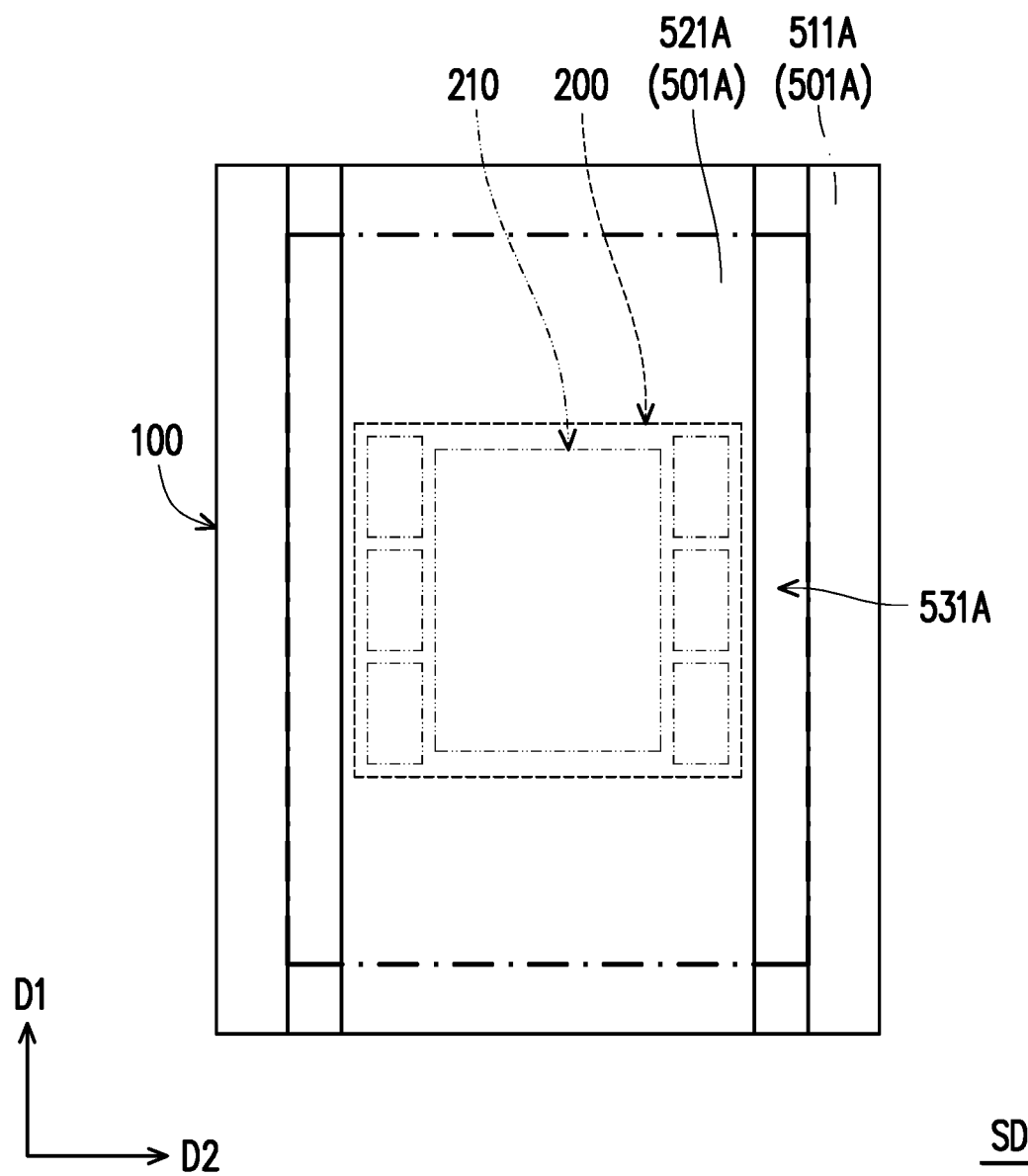

FIG. 2C is a schematic top view of a semiconductor device SD11 according to some embodiments of the disclosure. The semiconductor device SD11 may be similar to the semiconductor device SD10 illustrated in FIG. 2B and FIG. 1F. In some embodiments, the semiconductor device SD11 includes the metallic cover 501A. In the metallic cover 501A, the grooves 531A extend along the direction D1 further than the grooves 530A of the cover 500A of FIG. 2B. More specifically, the grooves 531A extend through the outer flanges 510A, and each groove 531A opens on a pair of opposite sides of the cover 501A.

Figure 2D:
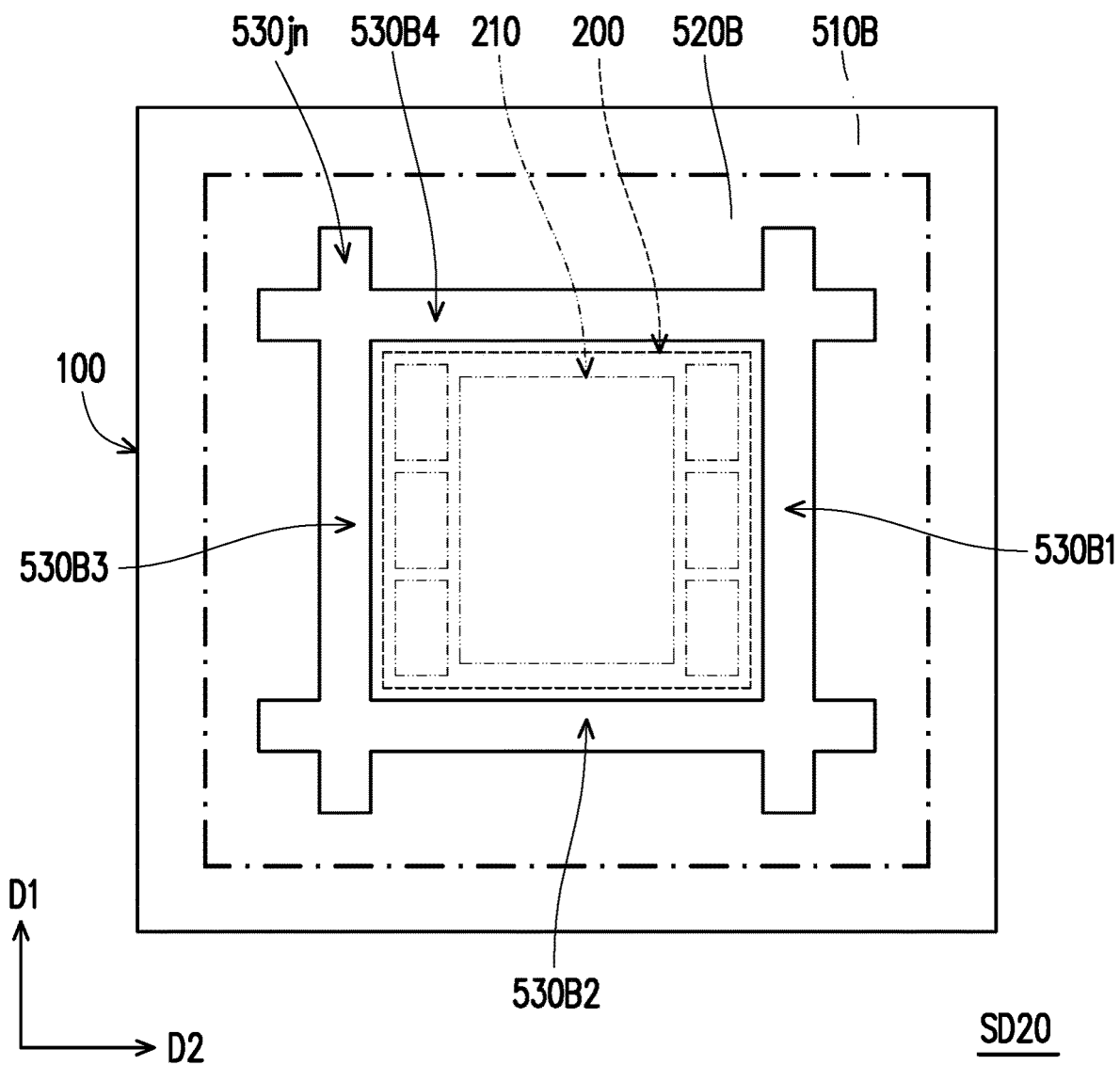

FIG. 2D is a schematic top view of a semiconductor device SD20 according to some embodiments of the disclosure. In some embodiments, the semiconductor device SD20 may be similar to the semiconductor device SD10 illustrated in FIG. 1F. In some embodiments, the semiconductor device SD20 includes a metallic cover 500B having four grooves 530B1-530B4 formed therein. In some embodiments, the grooves 530B1-530B4 extend along all sides of the semiconductor package 200. For example, the grooves 530B1 and 530B3 extend along a first pair of opposite sides of the semiconductor package 200, and the grooves 530B2 and 530B4 extend along the other pair of opposite sides of the semiconductor package 200 (when the semiconductor package 200 has a rectangular or square footprint). In some embodiments, the grooves 530B1-530B4 may intersect with the adjacent grooves forming junctions 530jn at the corners of the semiconductor package 200. For example, the groove 530B1 extends along the direction D1 and intersects with the adjacent grooves 530B2 and 530B4 (extending along the direction D2), and the groove 530B2 extends along the direction D2 and intersects with the adjacent grooves 530B1 and 530B3 (extending along the direction DD. In some embodiments, none of the grooves 530B1-530B4 reaches the outer flanges 510B. In some alternative embodiments, the grooves 530B1-530B4 may reach the outer flanges 510B along their respective extending directions. For example, the grooves 530B1 and 530B3 may reach the outer flanges 510B along their extending direction D1, and the grooves 530B2 and 530B4 may reach the outer flanges 510B along their extending direction D2.

Figure 2E:
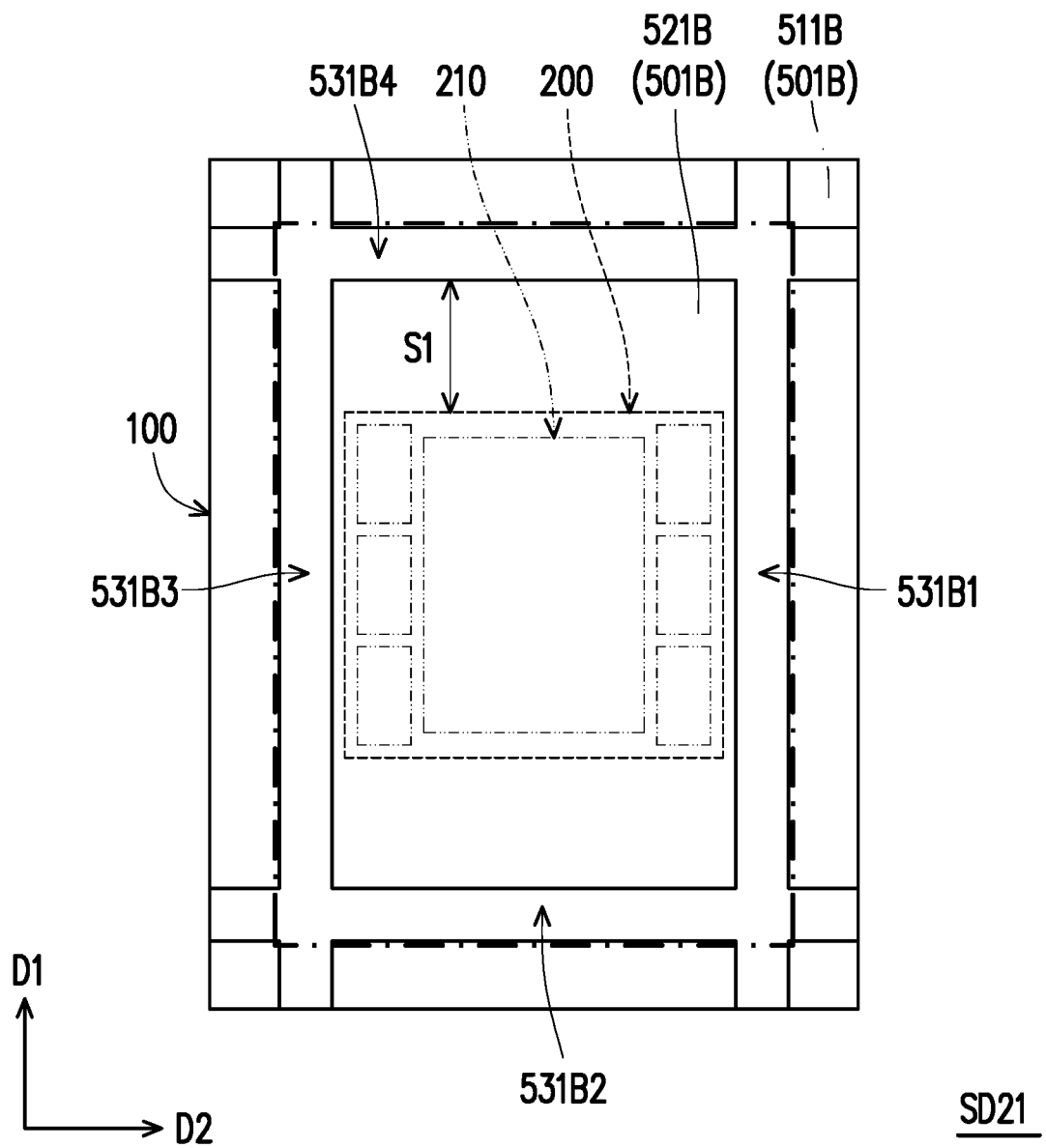

FIG. 2E is a schematic top view of a semiconductor device SD21 according to some embodiments of the disclosure. In some embodiments, the semiconductor device SD21 may be similar to the semiconductor device SD20 illustrated in FIG. 2D. The semiconductor device SD21 may include a metallic cover 501B including four grooves 531B1-531B4 similar to the metallic cover 500B of FIG. 2D. The grooves 531B1 and 531B3 may extend along the direction D1 at the sides of the semiconductor package 200, in a similar fashion as described for the grooves 531A of FIG. 2C. That is, the grooves 531B1 and 531B3 may span from the semiconductor package 200 to the outer flanges 511B of the metallic cover 501B along the direction D2, and may open on a pair of opposite sides of the metallic cover 501 along the direction D1, crossing through the outer flanges 511B. The grooves 531B2 and 531B4 may extend in the direction D2 along the outer flanges 511B, and intersect the grooves 531B1 and 531B3 at the corners of the outer flanges 511B. In some embodiments, the grooves 531B2, 531B4 are formed at a distance S1 along the direction D1 from the semiconductor package 200. That is, the region of thickness T1 (as illustrated, e.g., in FIG. 1F) extends further along the direction D1 than the span of the semiconductor package 200. In some embodiments, the distance S1 may be in the range from 1 mm to 8 mm. In some embodiments, the grooves 531B2 and 531B4 may open on a pair of opposite sides of the metallic cover 501B along the direction D2. That is, also the grooves 531B2 and 531B4 may extend across the outer flanges 511B after intersecting the grooves 531B1 and 531B3. As such, the corners of the outer flanges 511B may be surrounded by intersecting pairs of the grooves 531B1-531B4.

Figure 2F:
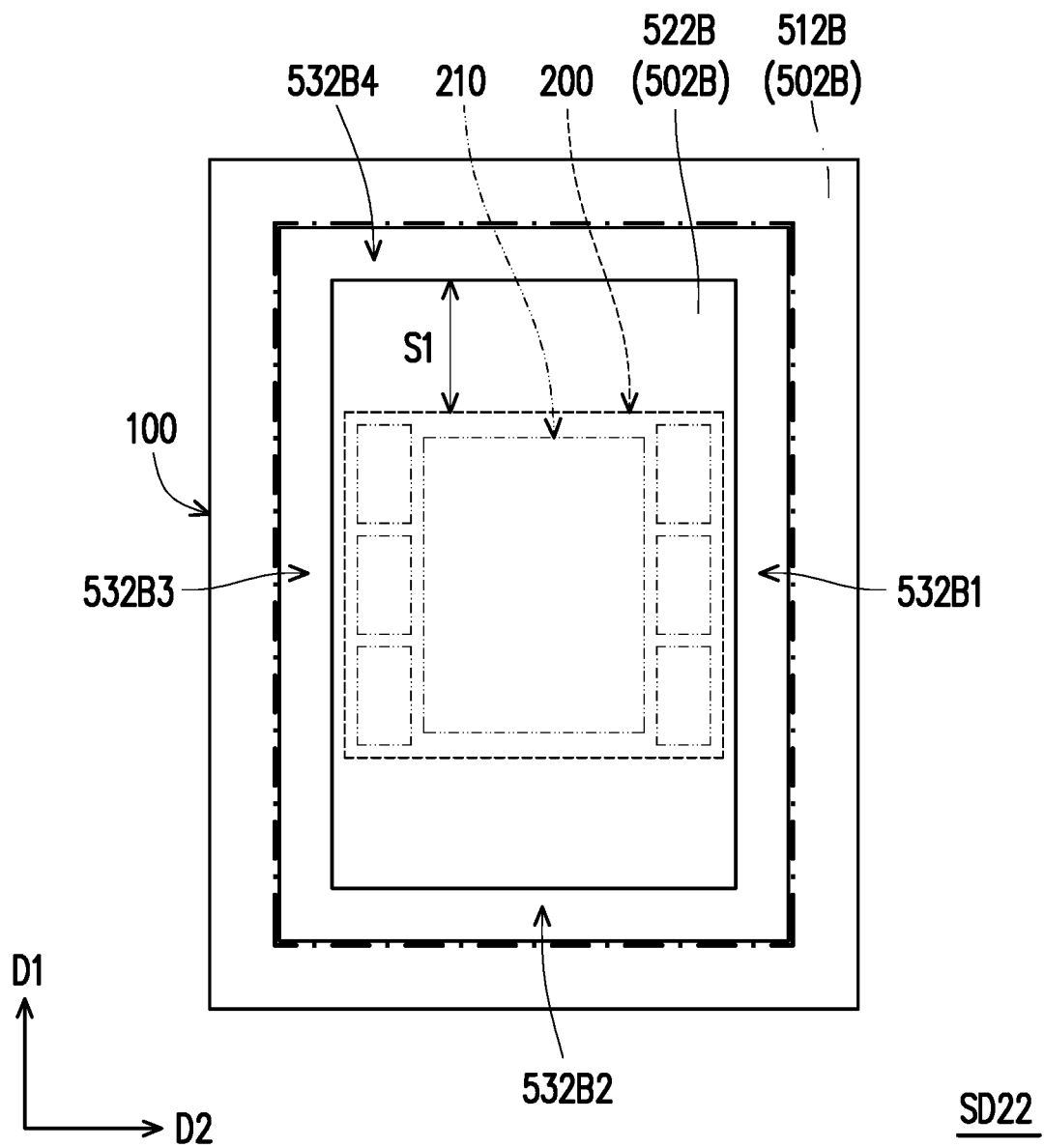

FIG. 2F is a schematic top view of a semiconductor device SD22 according to some embodiments of the disclosure. In some embodiments, the semiconductor device SD22 may be similar to the semiconductor device SD21 illustrated in FIG. 2E. The semiconductor device SD22 may include a metallic cover 502B including four grooves 532B1-532B4 similar to the metallic cover 501B of FIG. 2E. A difference between the metallic cover 502B and the metallic cover 501B of FIG. 2E is that the grooves 532B1-532B4 do not extend through the outer flanges 512B. That is, while the grooves 532B1-532B4 still extend along the outer flanges 512B, the grooves 532B1-532B4 do not open on the sides of the metallic cover 502B, but, rather, stop at the outer flanges 512B. In some embodiments, the outer flanges 512B and the grooves 532B1-532B4 may appear as concentric frames when viewed from the top as in FIG. 2F. As in the metallic cover 501B, the grooves 532B1 and 532B3 may span from the semiconductor package 200 to the outer flanges 512B, while the grooves 532B2 and 532B4 may be formed at a distance S1 from the semiconductor package 200.

Figure 2G:
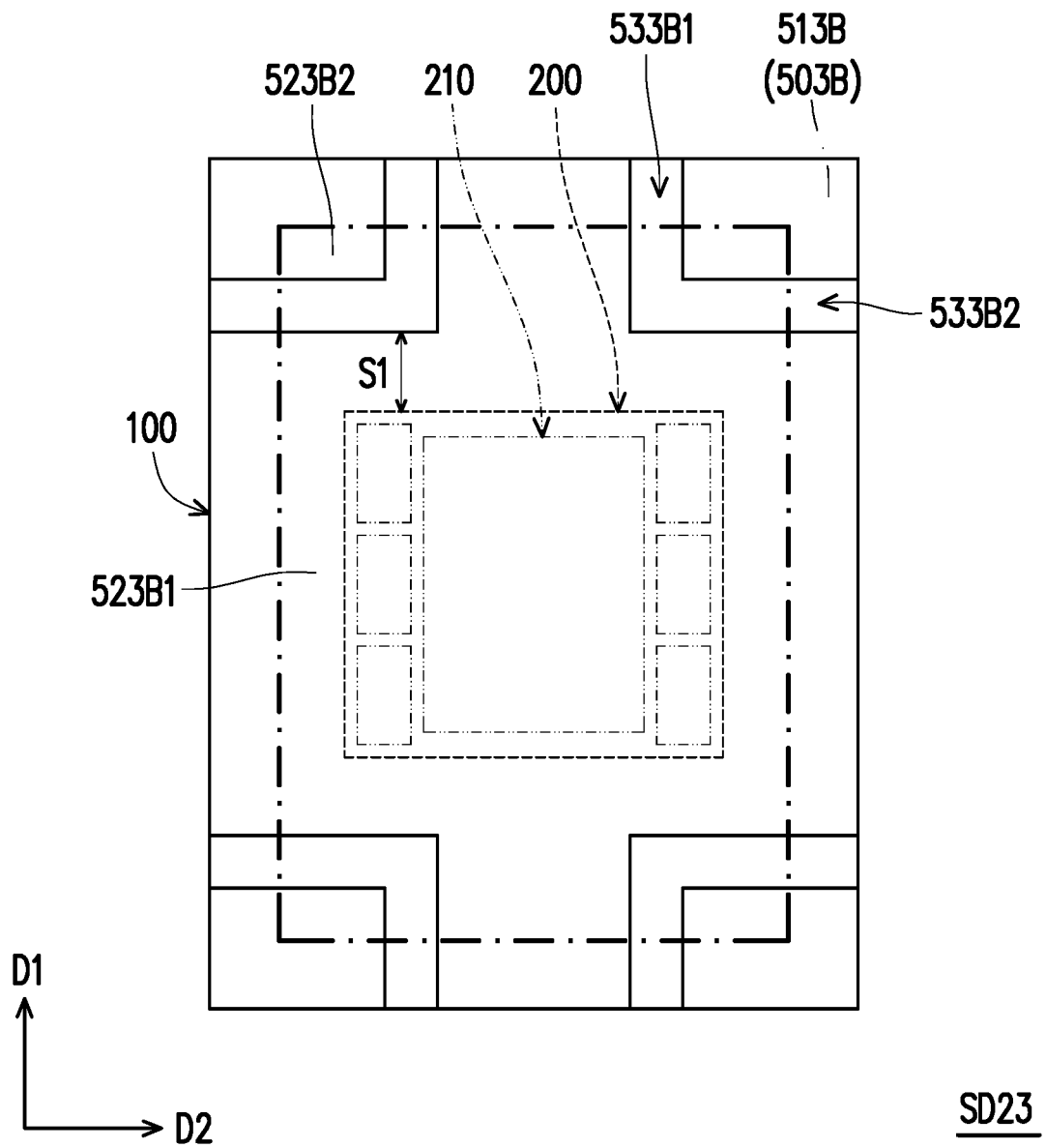

FIG. 2G is a schematic top view of a semiconductor device SD23 according to some embodiments of the disclosure. In some embodiments, the semiconductor device SD23 may be similar to the semiconductor device SD21 illustrated in FIG. 2E. The semiconductor device SD23 may include a metallic cover 503B including four pair of grooves 533B1-533B2. The grooves 533B1 may extend along the direction D1 and the grooves 533B2 may extend along the direction D2. Each pair of grooves may include a groove 533B1 joint to a groove 533B2 at a corner of the metallic cover 503B. In some embodiments, each of the grooves 533B1 and 533B2 may open on one side of the metallic cover 503B and extend until it joints the other groove 533B2 or 533B1 of the pair to which it belongs. For example, a groove 533B1 may open on a side of the metallic cover 503B and extend in the direction D1 until it joins with a groove 533B2 extending along the direction D2, without extending further than the groove 533B2. Similarly, the groove 533B2 may not extend further along the direction D2 than the groove 533B1 with which it joints. In some embodiments, the grooves 533B2 are formed at the distance S1 along the direction D1 from the semiconductor package 200. As such, the lid 523B of the metallic cover 503B may include a region 523B1 of thickness T1 (as illustrated, e.g., in FIG. 1F) on the semiconductor package 200 and extending further than the semiconductor package 200 on both directions D1 and D2. Along the direction D2, the region 523B1 may reach the outer flanges 513B everywhere in correspondence of the span of the semiconductor package 200. Along the direction D1, the region 523B1 may reach the outer flanges 513B in between the grooves 533B1 and reach the grooves 533B2 elsewhere. The lid 523B may reach a thickness T2 (as illustrated, e.g., in FIG. 1F) in correspondence of the grooves 533B1, 533B2, and include a region 523B2 of thickness greater than T2 in between the grooves 533B1, 533B2 and the outer flanges 513B. The regions 523B2 of thickness greater than T2 may be enclosed on two consecutive sides by a corner of the outer flanges 513B, and on the other two sides by a pair of grooves 533B1 and 533B2. In some embodiments, the regions 523B1 and 523B2 may have the same thickness T1, but the disclosure is not limited thereto. In some alternative embodiments, one of the regions 523B1 and 523B2 may be thicker than the other, while both are thicker than the regions in which the grooves 533B1 and 533B2 are formed.

Figure 2H:
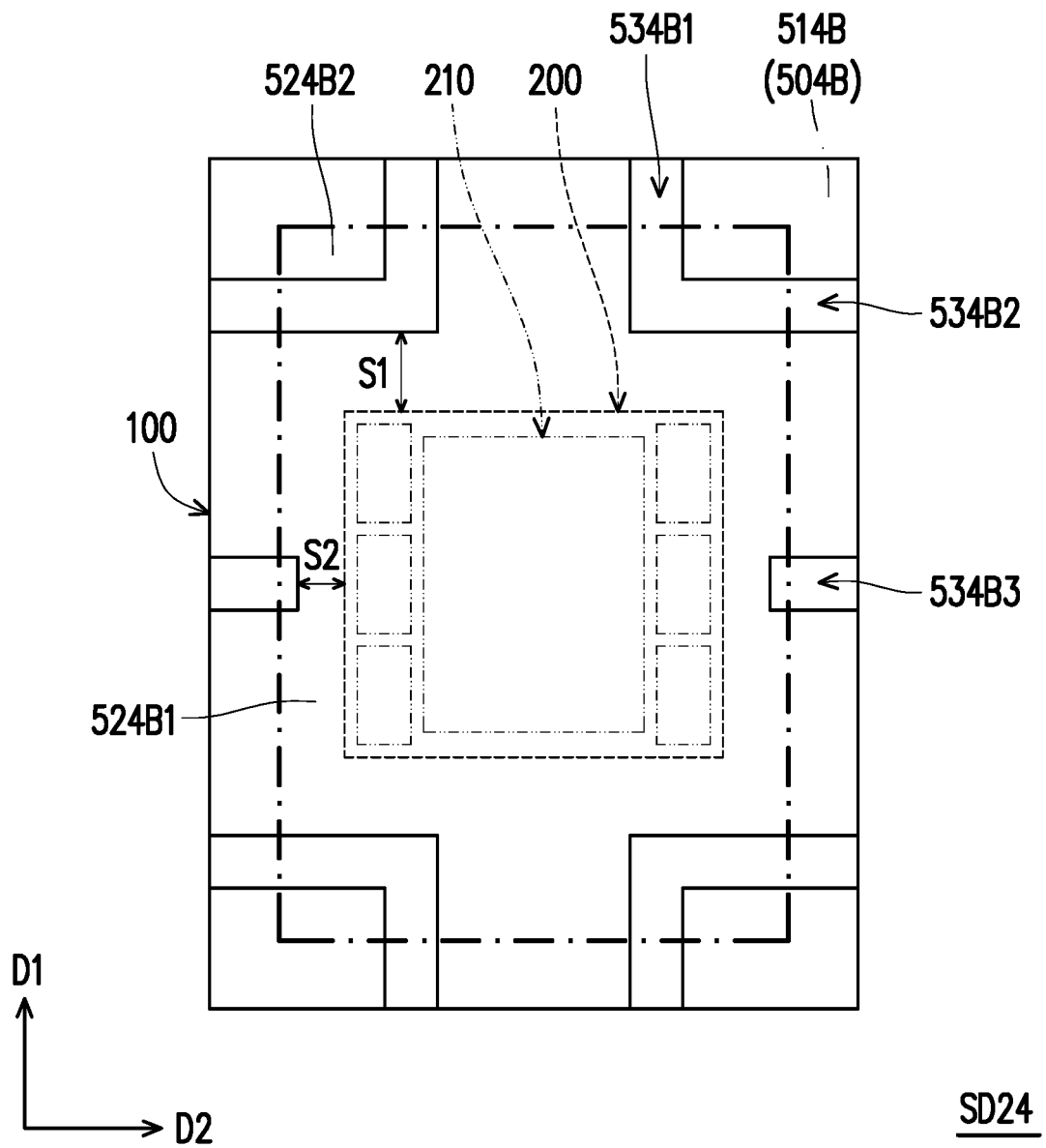

FIG. 2H is a schematic top view of a semiconductor device SD24 according to some embodiments of the disclosure. In some embodiments, the semiconductor device SD24 may be similar to the semiconductor device SD23 illustrated in FIG. 2G. The semiconductor device SD24 includes the metallic cover 504B. A difference between the metallic cover 504B and the metallic cover 503B of FIG. 2G is that the metallic cover 504B further includes grooves 534B3 formed in between opposite pairs of grooves 534B2 (the grooves extending along the direction D2). In some embodiments, the grooves 534B3 extend along the direction D2 from the sides of the metallic cover 504B, through the outer flanges 514B. In some embodiments, the grooves 534B3 extend from the sides of the metallic cover 504B towards the semiconductor package 200 without reaching the semiconductor package 200. That is, the grooves 534B3 may open at a distance S2 along the direction D2 from the semiconductor package D2. In same embodiments, the distance S2 may be in the range from 1 mm to 6 mm. In some embodiments, the region 524B1 of thickness T1 (as illustrated, e.g., in FIG. 1F) of the lid 504B may reach the outer flanges 514B along the direction D2 everywhere in between the grooves 534B2 but in the region where the grooves 534B3 are formed.

Figure 3A:
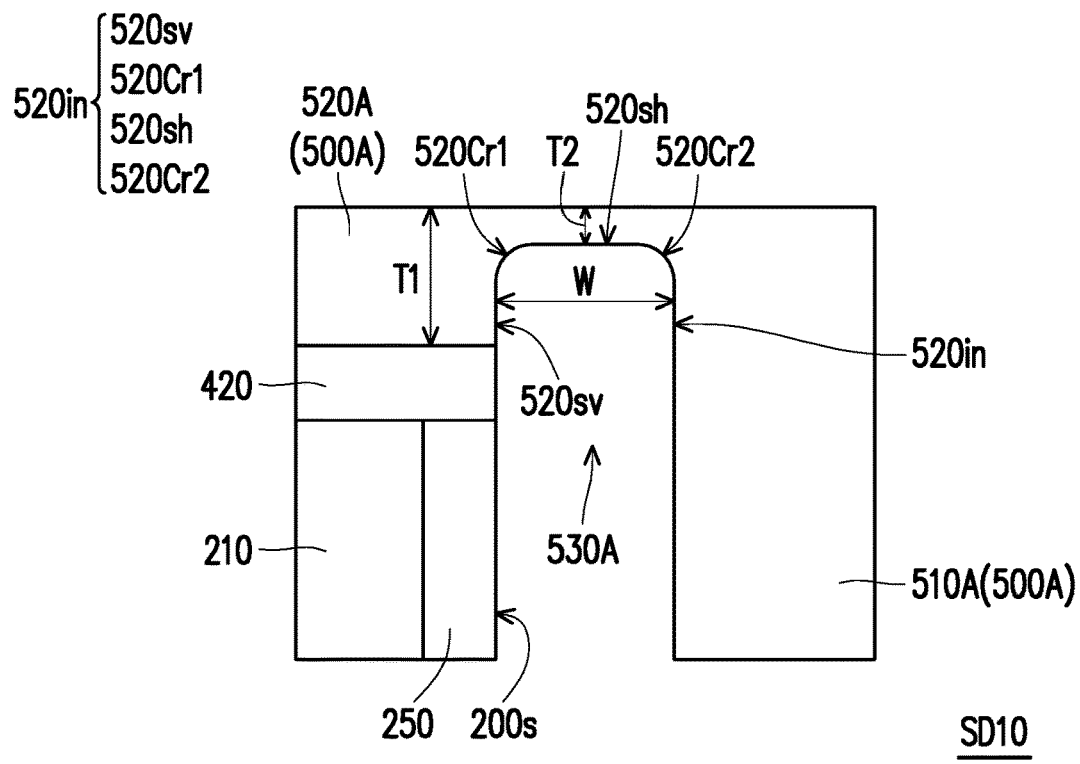
FIG. 3A to FIG. 3G are schematic cross-sectional views of portions of semiconductor devices according to some embodiments of the present disclosure.

FIG. 3A to FIG. 3G are schematic cross-sectional views of portions of semiconductor devices according to some embodiments of the disclosure. The semiconductor devices of FIG. 3A to FIG. 3G may be similar to the semiconductor device SD10 of FIG. 1F. In some embodiments, the views of FIG. 3A to FIG. 3G corresponds to the area A indicated in FIG. 1F. In FIG. 3A is illustrated a portion of the semiconductor device SD10 according to some embodiments of the disclosure. In some embodiments, the lid 520A has a first thickness T1 over the semiconductor package 200 and the TIM 420 and a second thickness T2 in a region on a side of the semiconductor package 200. In some embodiments, the groove 530A of the metallic cover 500A is defined by the contiguous inner surfaces 510in and 520in of the outer flanges 510A and the lid 520A. In some embodiments, the inner surface 520in of the lid 520A may include several contiguous portions. For example, moving from the semiconductor package 200 towards the outer flanges 510A, a vertical section 520sv may be substantially parallel to the side surface 200s of the semiconductor package 200. In some embodiments, the vertical section 520sv may be vertically aligned with respect to the side surface 200s of the semiconductor package. The vertical section 520sv may be followed by a curved section 520Cr1. The curved section 520Cr1 may result from the continuous decrease of the thickness of the lid 520A, and have, as such, a concave profile. The curved section 520Cr1 may joint the vertical section 520sv to a horizontal section 520sh, in which the lid 520A has the thickness T2. The extension of the horizontal section 520sh may vary, resulting in different profiles and overall width W of the groove 530A. The horizontal section 520sh may be joint to the inner surface 510in of the outer flanges 510A by another curved section 520Cr2. The curved section 520Cr2 may be result from an increase in the thickness of the lid 520A moving away from the semiconductor package 200 and the deepest point of the groove 530A. In some embodiments, the curved sections 520Cr1 and 520Cr2 may have a smooth profile (e.g., a rounded profile). The inner surface 510in of the outer flanges 510A may be substantially vertical and parallel to the vertical section 520sv and the side surface 200s. In some embodiments, the width W of the groove 530A may be considered as a horizontal distance between the vertical section 520sv and the inner surface 520in. In the metallic cover 500A, the outer flanges 510A and the lid 520A may be integrally formed, with no visible interface at their joint.

Figure 3B:
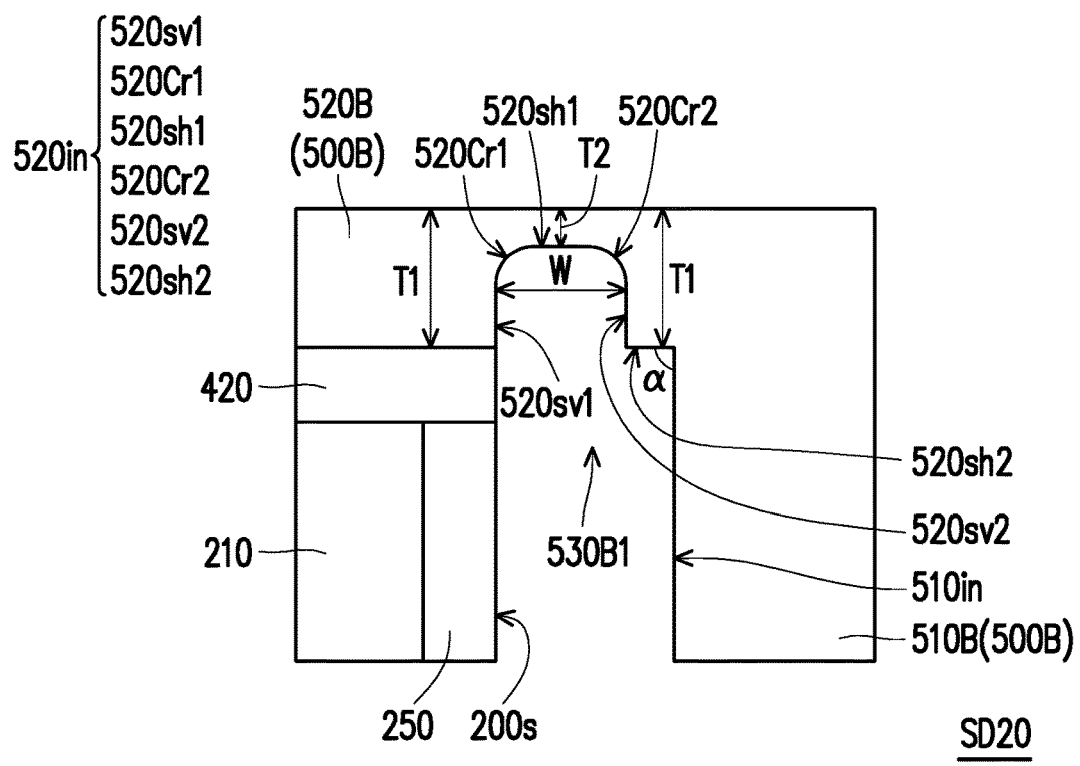

In FIG. 3B is illustrated a portion of the semiconductor device SD20 of FIG. 2D according to some embodiments of the disclosure. While in FIG. 3B is illustrated the groove 530B1, the structure of the other grooves 530B2-530B4 may be similar. In the metallic cover 500B, the inner surface 520in of the lid 520B includes a vertical section 520sv1 parallel (and, in some embodiments, coplanar) with the side surface 200s of the semiconductor package 200, a curved section 520Cr1 joining the vertical section 520sv1 with a horizontal section 520sh1, a curved section 520Cr2 joining the horizontal section 520sh1 with a vertical section 520sv2, and a horizontal section 520sh2, bridging the vertical section 520sv2 with the inner surface 510in of the outer flanges 510B. In some embodiments, the groove B1 is formed, in order, by the vertical section 520sv1, the curved section 520Cr1, the horizontal section 520sh1, the curved section 520Cr2, and the vertical section 520sv1. In some embodiments, the lid 520B has the thickness T1 over the semiconductor package 200, the thickness T2 in correspondence of the horizontal section 520sh1, and again the thickness T1 in correspondence of the horizontal section 520sh2, where the thickness T2 is smaller than the thickness T1. However, the disclosure is not limited thereto, and in some alternative embodiments, the lid 520B may present a thickness different than T1 in correspondence of the horizontal section 520sh2. In some embodiments, the horizontal section 520sh2 joints the inner surface 510in defining a right angle α. In some embodiments, the width W of the groove 530B1 may be considered as the distance between the vertical section 520sv1 and the vertical section 520sv2.

Figure 3C:
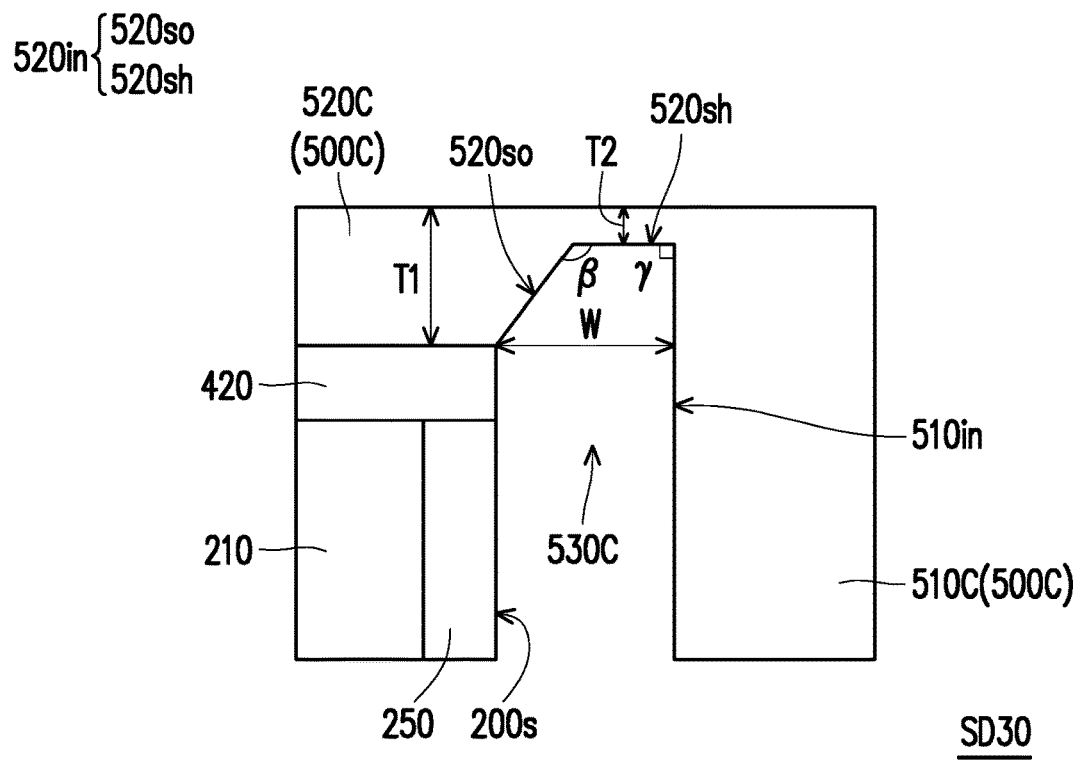

In FIG. 3C is illustrated a portion of a semiconductor device SD30 according to some embodiments of the disclosure. In some embodiments, the semiconductor device SD30 includes the metallic cover 500C. In some embodiments, the inner surface 510in of the lid 520C includes an oblique section 520so joining the regions of the lid 520C with thickness T1 and thickness T2. That is, the oblique section 520so may extend obliquely from a plane in which the side surface 200s of the semiconductor package 200 lies to the beginning of the horizontal section 520sh. In some embodiments, the oblique section 520so may form an obtuse angle β with the horizontal section 520sh, and the two sections 520so and 520sh may form a sharp joint (e.g., having a non-rounded, not smooth profile). However, the disclosure is not limited thereto. In some alternative embodiments, the joint between the oblique section 520so and the horizontal section 520sh may be rounded. In some embodiments, the horizontal section 520sh may correspond to the region of the lid 520C having the thickness T2. The horizontal section 520sh may be directly joint to the inner surface 510in of the outer flanges 510C, defining a right angle γ. That is, the groove 530C may have a right trapezoidal profile. In some embodiments, the width W of the groove 530C may be considered as the distance between the end of the oblique section 520so further away from the horizontal section 520sh and the inner surface 510in of the outer flanges 510C (e.g., the major basis of the trapezoid).

Figure 3D:
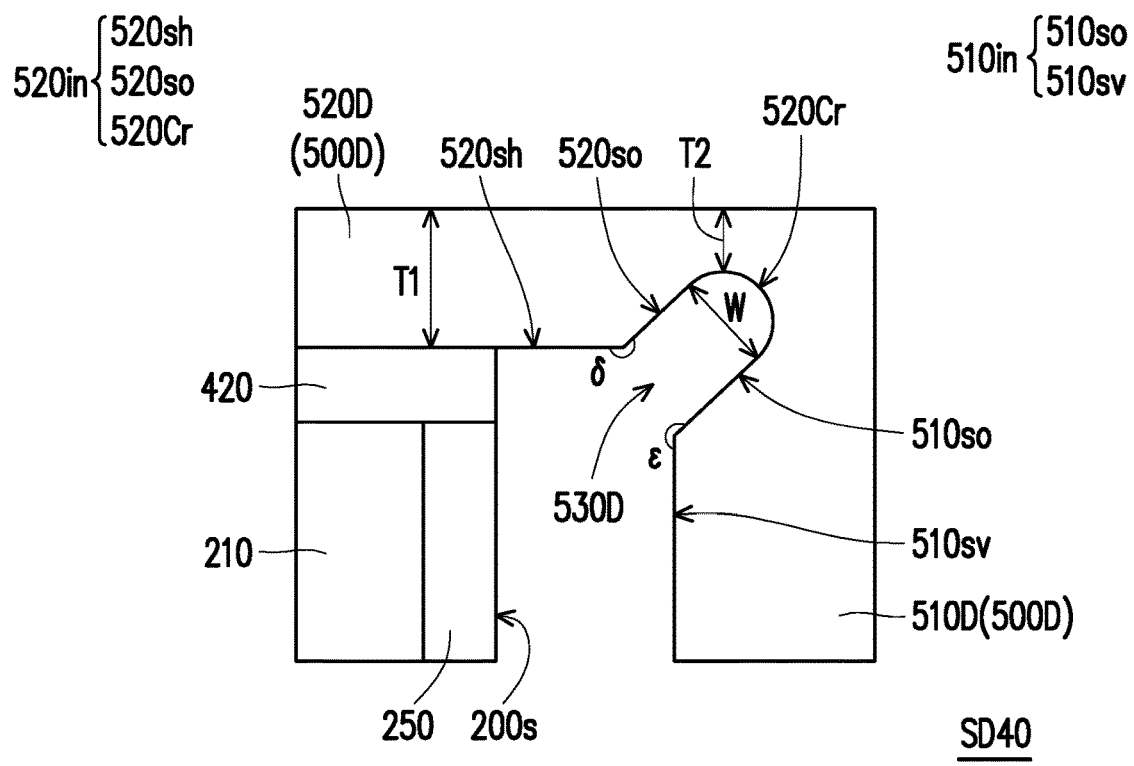

In FIG. 3D is illustrated a portion of a semiconductor device SD40 according to some embodiments of the disclosure. In some embodiments, the semiconductor device SD40 includes the metallic cover 500D. In some embodiments, the metallic cover 500D has the thickness T1 over the semiconductor package 200 and in an area immediately adjacent the semiconductor package 200 overlying the circuit substrate 100 (shown in FIG. 1F). That is, the inner surface 520in of the lid 520D includes a horizontal section 520sh protruding with respect to the semiconductor package 200. In the portion corresponding to the horizontal section 520sh, the lid 520D may have the same thickness T1 as in the portion overlying the semiconductor package 200. The horizontal section 520sh may be followed by an oblique section 520so forming a reflex angle δ with the horizontal section 520sh. A (smooth) curved section 520Cr may follow the oblique section 520so and joints the oblique section 520so to an oblique section 510so of the inner surface 510in of the outer flanges 510D. The lid 520D may reach the minimum thickness T2 at a point along the curved section 520Cr. The inner surface 510in may include the oblique section 510so and a vertical section 510sv forming a reflex angle ε with the oblique section 510so. That is, the groove 530D may extend in an oblique direction with respect to the horizontal plane of the lid 520D or the vertical plane of the outer flanges 510D, at the joint between the lid 520D and the outer flanges 510D. In some embodiments, the groove 530D has a shape corresponding to a parallelepiped having an hemicylindrical end. The width W of the groove 530D may be considered the distance between the oblique sections 520so and 510so.

Figure 3E:
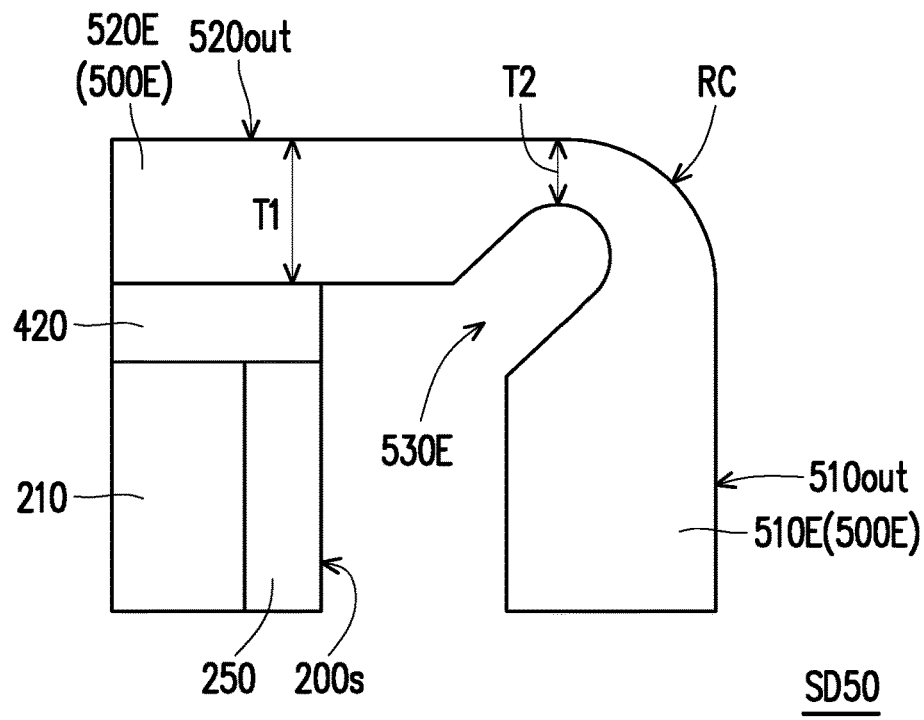

In FIG. 3E is illustrated a portion of a semiconductor device SD50 according to some embodiments of the disclosure. In the semiconductor device SD50, the metallic cover 500E is included in place of the metallic cover 500D of the semiconductor device SD40 of FIG. 3C. A difference between the metallic cover 500D and the metallic cover 500E lies in the respective outer surfaces 520out and 510out of the lid 520E and the outer flanges 510E joining to form a rounded (smooth) corner RC rather than a sharp corner as in the metallic cover 500D. Other features (e.g., the positions and shapes of the respective grooves 530D, 530E) may be similar between the two covers 500D and 500E.

Figure 3F:
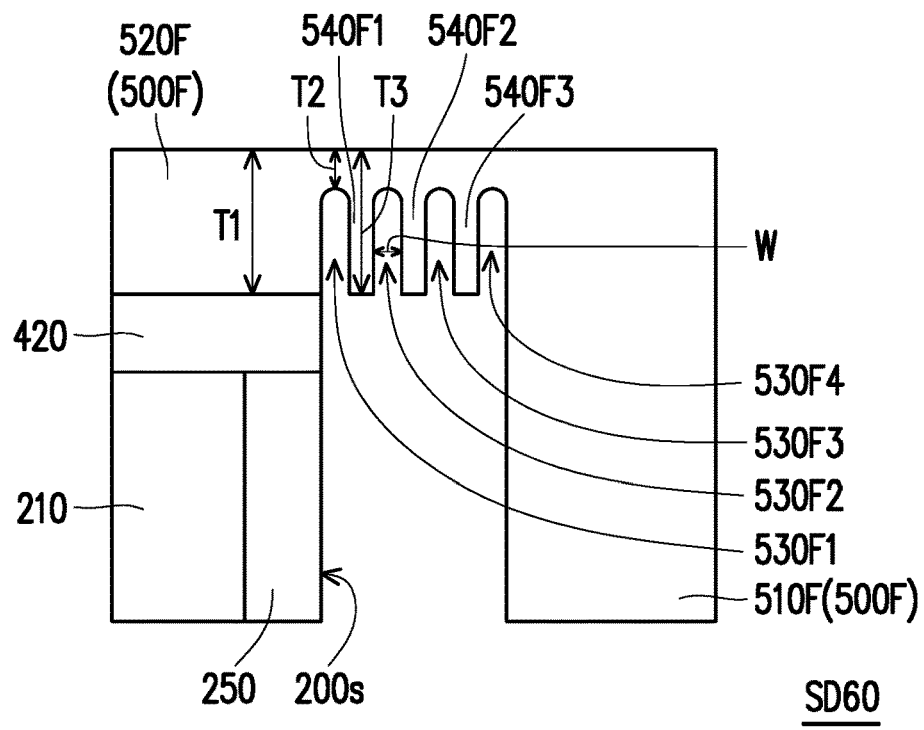

In FIG. 3F is illustrated a portion of a semiconductor device SD60 according to some embodiments of the disclosure. The semiconductor device SD60 may include the metallic cover 500F. In the metallic cover 500F, a plurality of grooves 530F1-530F4 is formed in the lid 520F in an area beside the semiconductor package 200. That is, the lid 520F may include a portion having a thickness T1 over the semiconductor package 200, followed by alternating portions having thicknesses T2 and T3 (where the thickness T2 is smaller than the thickness T3). That is, the adjacent grooves 530F1-530F4 (the portions in which the lid 520F reaches the thickness T2) may be separated from each other by protrusions 540F1-540F3 (the portions in which the lid 520F reaches the thickness T3). In some embodiments, the thickness T3 may be in the range from 0.5 mm to 3 mm. In some embodiments, a ratio of the thickness T2 to the thickness T3 may be in the range from 0.2 to 0.7. In some embodiments, a ratio of the thickness T1 to the thickness T3 may be in the range from 0.2 to 0.5. In some embodiments, the width W of the grooves 530F1-530F4 may be considered as the horizontal distance between the corresponding protrusions 540F1-540F3, or, in the case of the first groove 530F1, between the protrusion 540F1 and the portion of the lid 520F having thickness T1, and, in the case of the last groove 530F4, between the protrusion 540F3 and the outer flanges 510F. In some embodiments, when multiple grooves 530F1-530F4 are included, the width W of each groove is in the range from 0.5 mm to 2 mm. While in FIG. 3F the metallic cover 500F is illustrated as including four grooves 530F1-530F4 and three protrusions 540F1-540F3, the disclosure is not limited thereto. In alternative embodiments, fewer or more grooves 530F1-530F4 and protrusions 540F1-540F3 may be formed.

Figure 3G:
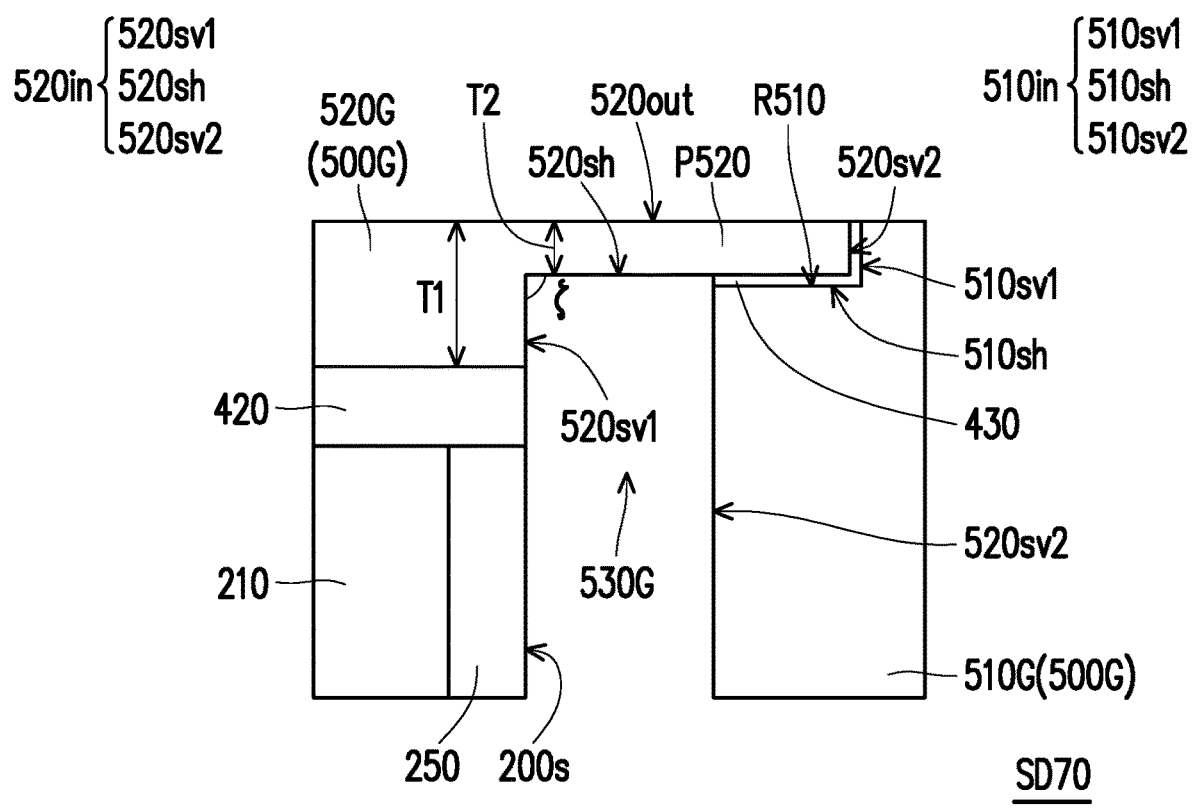

In FIG. 3G is illustrated a portion of a semiconductor device SD70 according to some embodiments of the disclosure. The semiconductor device SD70 includes the metallic cover 500G. In the metallic cover 500G, the lid 520G and the outer flanges 510G are separately formed, and are joined by an adhesive 430. In some embodiments, the lid 520G includes a region having a thickness T1 over the semiconductor package 200 and a protrusion P520 having a thickness T2 directly joined to the region of thickness T1. That is, an inner surface 520in of the lid 520G may include a vertical section 520sv1 substantially parallel to the side surface 200s of the semiconductor package 200, a horizontal section 520sh contiguous to the vertical section 520sv1 and forming a right angle ζ with the vertical section 520sv1, and a vertical section 520sv2 contiguous to the horizontal section 520sh and joining the horizontal section 520sh to the outer surface 520out of the lid 520G. In some embodiments, the vertical section 520sv2 and the horizontal section 520sh may be orthogonal with respect to each other. In some embodiments, the outer flanges 510G have a recess R510 formed at their upper end which receives a portion of the protrusion P520. The recess R510 may be defined by a vertical section 510sv1 and a contiguous horizontal section 510sh of the inner surface 510in. In some embodiments, the adhesive 430 is disposed in the recess R510 between the outer flanges 510G and the lid 520G. The inner surface 510in may further include a vertical section 510sv2 contiguous to the horizontal surface 520sh. In some embodiments, the vertical section 510sv2 faces the vertical section 520sv1 and the side surface 200s of the semiconductor package 200. In some embodiments, the groove 530G of the metallic cover 500G may have a substantially rectangular profile.

In some embodiments, each one of the covers 500A-500G discussed above allows for at least some relative motion between the outer flanges 510A-51OG and the corresponding lids 520A-520G. As a result, the covers 500A-50OG may have a reduced tendency to permanently deform during usage or testing of the corresponding semiconductor devices SD10-SD70, thus reducing delamination between the lids 520A-G and the underlying TIM 420, and increasing yield and reliability. In the remaining part of the disclosure, the joint between the joint between the lids 520 and the outer flanges 510 of the covers 500 (e.g., the positions and shapes of the grooves 530) are illustrated with the structure of the metallic cover 500A for simplicity of illustration. It is understood, however, that the disclosure also contemplates use of any one of the configurations described in FIG. 3A to FIG. 3G for the covers of the semiconductor packages described hereafter.

Figure 4A:
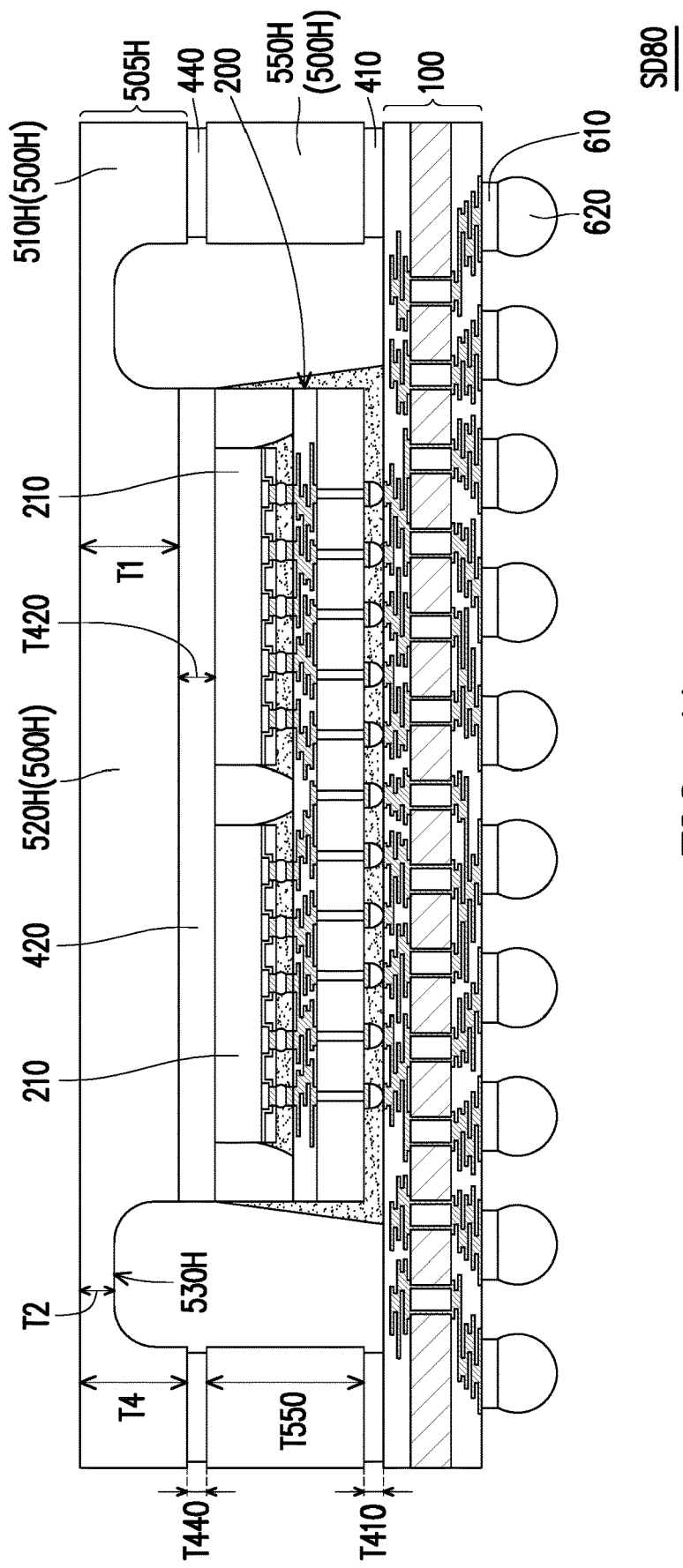
FIG. 4A is a schematic cross-sectional view of semiconductor device according to some embodiments of the disclosure.
Figure 4B:
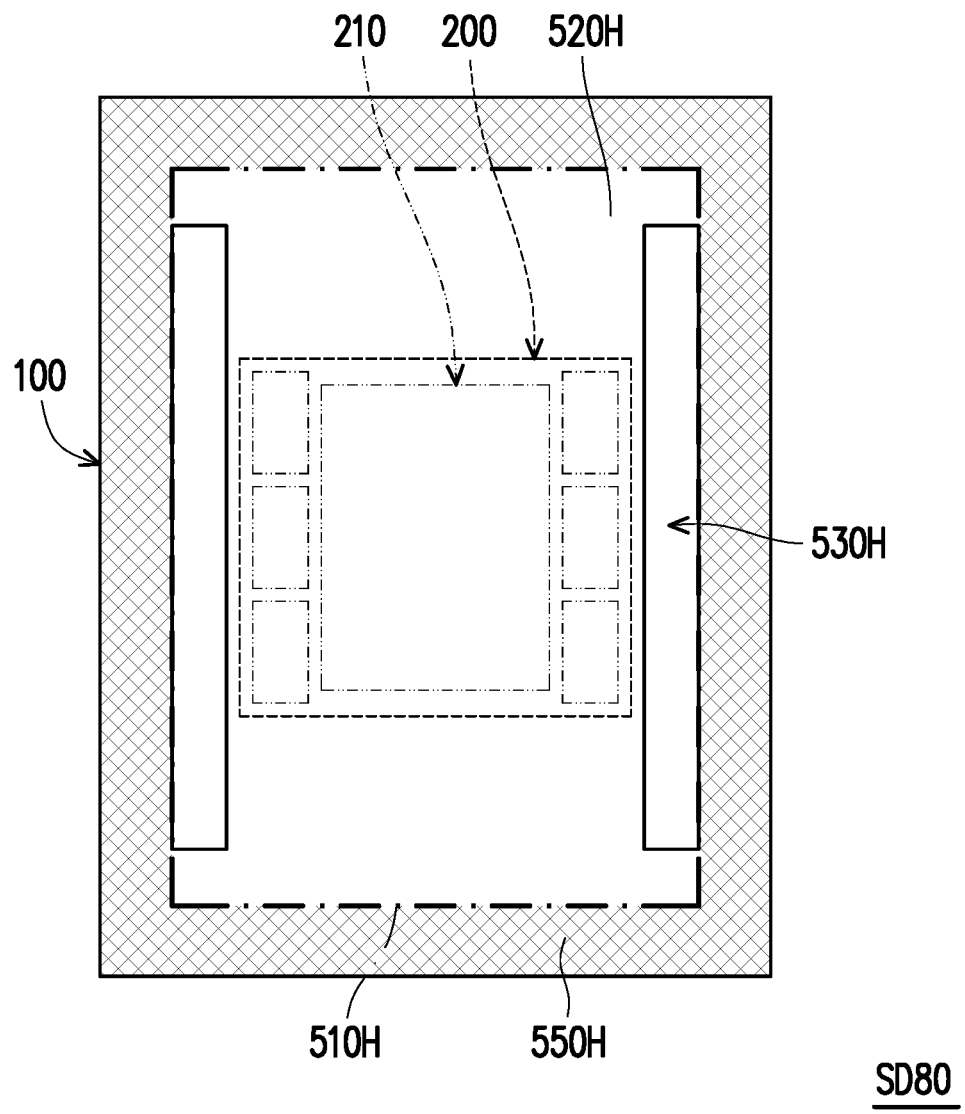
FIG. 4B is a schematic top view of a semiconductor device according to some embodiments of the disclosure.

FIG. 4A is a schematic cross-sectional view of a semiconductor device SD80 according to some embodiments of the disclosure. FIG. 4B is a schematic top view of the semiconductor device SD80 according to some embodiments of the disclosure. The semiconductor device SD80 may be similar to the semiconductor device SD10 of FIG. 1F. In some embodiments, the semiconductor device SD80 has a metallic cover 500H including the outer flanges 510H, the lid 520H, and a support 550H. In some embodiments, the lid 520H and the outer flanges 510H may be considered a cap 505H disposed on the support 550H and the semiconductor package 200. That is, in the metallic cover 500H, the outer flanges 510H land on the support 550H, and the support 550H is interposed between the outer flanges 510H and the circuit substrate 100. The lid 520H has a thickness T1 over the semiconductor package 200 and a minimum thickness T2 at the deepest point of the groove 530H disposed on the side of the semiconductor package 200. The outer flanges 510H are integrally formed with the lid 520H and have a thickness T4 over the support 550H. In some embodiments, the thickness T4 may be in the range from 0.5 mm to 3 mm. In some embodiments, a ratio of the thickness T2 to the thickness T4 may be in the range from 0.2 mm to 2.5 mm. In some embodiments, a ratio of the thickness T1 to the thickness T4 may be in the range from 0.3 to 2. In some embodiments, the support 550H has a continuous or discontinuous annular shape. In some embodiments, a footprint of the support 550H (illustrated as a grid in FIG. 4B) matches in shape and size and is substantially aligned with a footprint of the outer flanges 510H. In some embodiments, a thickness T550 of the support 550H may be in the range from 0.5 mm to 3 mm. In some embodiments, the support 550H may include a same material as the cap 505H. In some alternative embodiments, the material of the support 550H may be different from the material of the cap 505H. In some embodiments, the support 550H may include stainless steel, silicon carbide alloy, machinable ceramic, dummy silicon, kovar, invar, copper alloys, molybdenum, copper- or nickel-clad molybdenum, copper-clad Invar, copper tungsten, aluminum or combination thereof. In some embodiments, when stainless steel is used as a material for the support 550H, co-planarity of the whole package may be reduced, thus enhancing the solder joint at the board level assembly. In some embodiments, the adhesive 410 secures the support 550H to the circuit substrate 100 and an adhesive 440 secures the outer flanges 510H to the support 550H. In some embodiments, the properties of the adhesive 410 are the ones previously described with reference to FIG. 1C. In some embodiments, the adhesive 440 may be similar to the adhesive 410. In some alternative embodiments, the adhesive 440 may be a Hi-elongation adhesive. That is, the adhesive 440 may have an elastic modulus in the range from 5 MPa to 50 MPa, for example, less than 50 MPa. In some embodiments, the elongation of the adhesive 440 is greater than 50%, for example in the range from 50% to 200%. In some embodiments, the elastic modulus of the adhesive 410 may be greater than the elastic modulus of the adhesive 440. In some embodiments, a thickness T440 of the adhesive 440 is in the range from 80 micrometers to 250 micrometers. In some embodiments, a thickness T420 of the TIM 420 is in the range from 50 micrometers to 200 micrometers.

Figure 5:
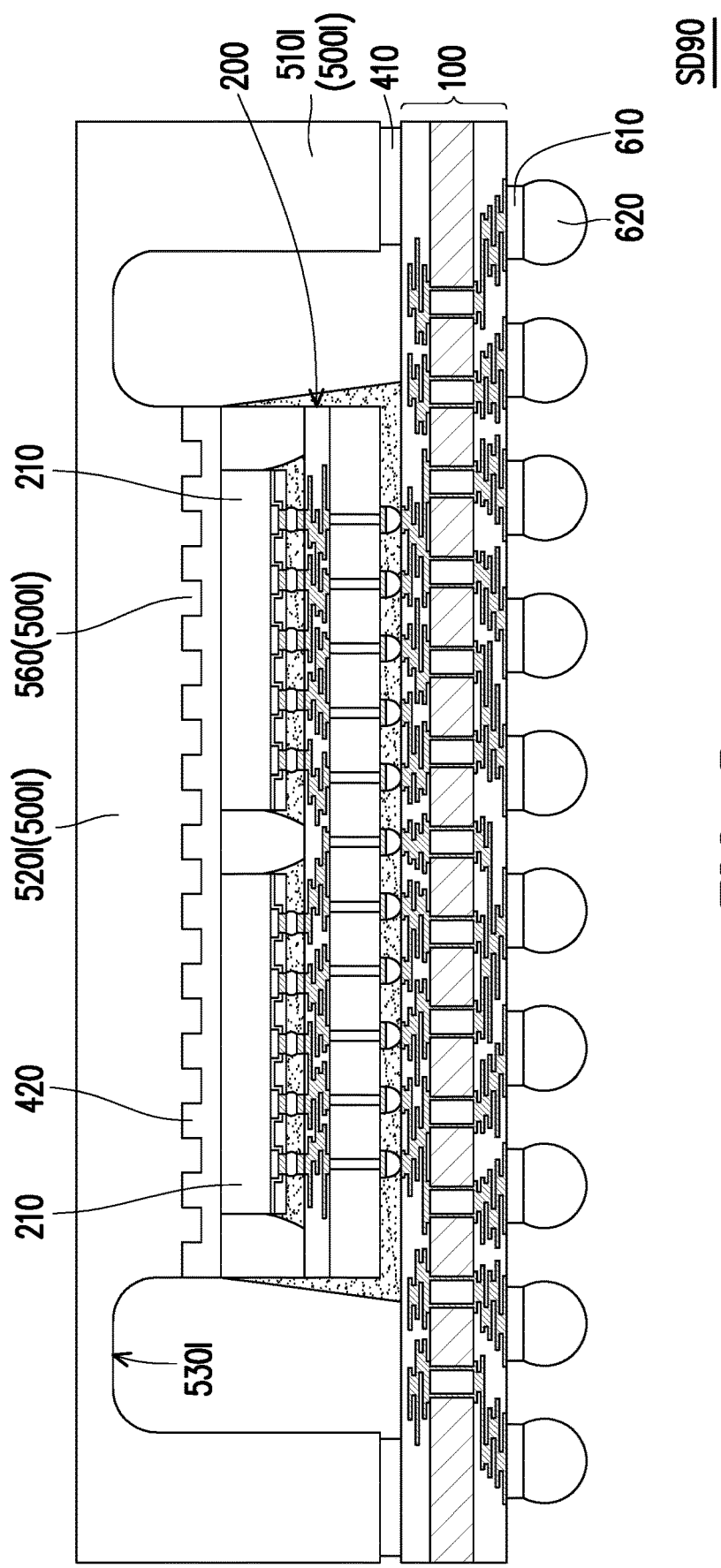
FIG. 5 is a schematic cross-sectional view of a semiconductor device according to some embodiments of the disclosure.

FIG. 5 is a schematic cross-sectional view of a semiconductor device SD90 according to some embodiments of the disclosure. The semiconductor device SD90 may be similar to the semiconductor device SD10 of FIG. 1F. In some embodiments, the semiconductor device SD90 includes the circuit substrate 100, the semiconductor package 200 bonded to the circuit substrate 100, and the metallic cover 500I disposed on the circuit substrate 100. The metallic cover 500I may present grooves 530I on the sides of the semiconductor package 200. The metallic cover 500I may be fixed to the circuit substrate 100 by the adhesive 410, and be in contact with the TIM 420 on top of the semiconductor package 200. In some embodiments, the metallic cover 500I may include protrusions 560I protruding from the lid 520I into the TIM 420. The protrusions 560I may confer an embattled profile to the portion of the metallic cover 500I in contact with the TIM 420. As a result, the contact area between the metallic cover 500I and the TIM 420 may increase, and heat produced by the semiconductor device SD90 may be more efficiently dissipated.

Figure 6A:
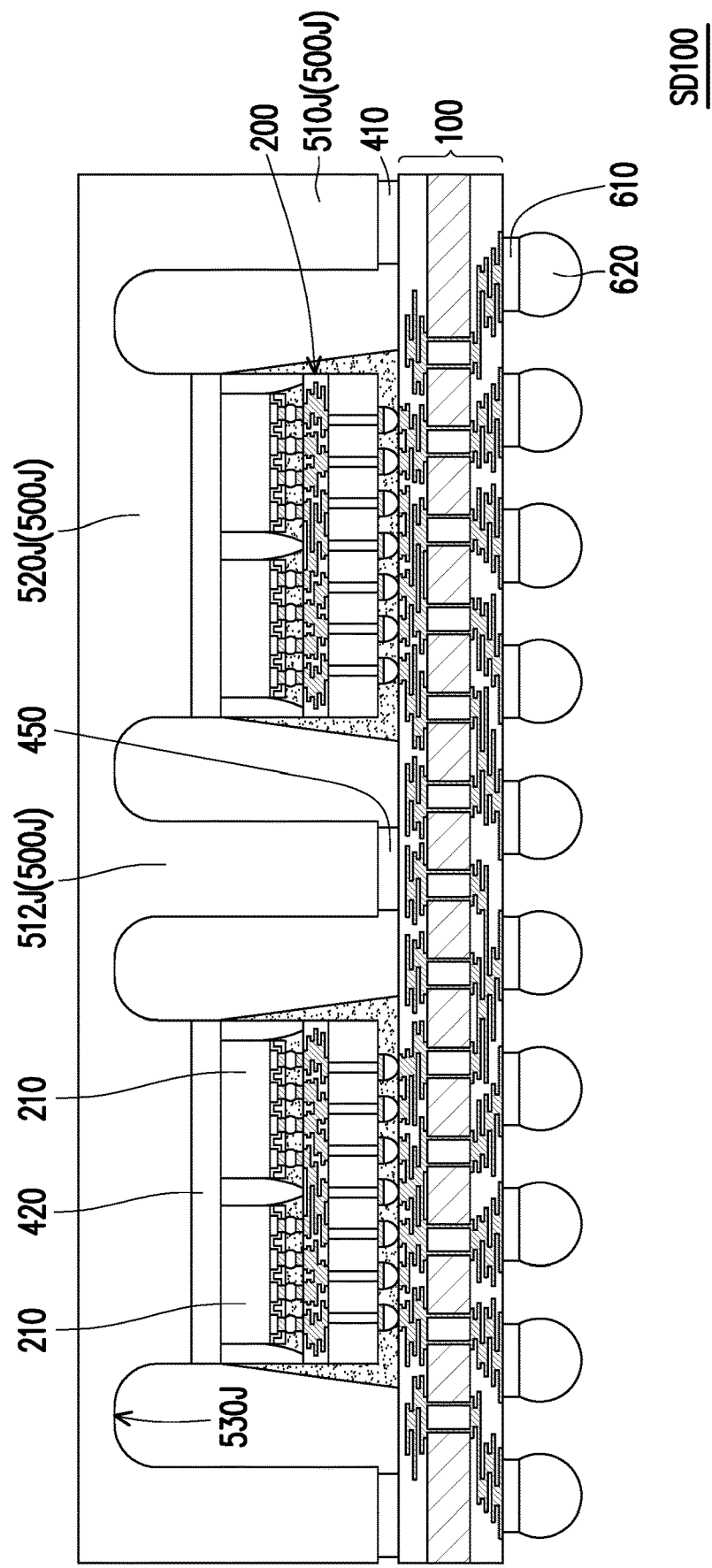
FIG. 6A is a schematic cross-sectional view of a semiconductor device according to some embodiments of the disclosure.
Figure 6B:
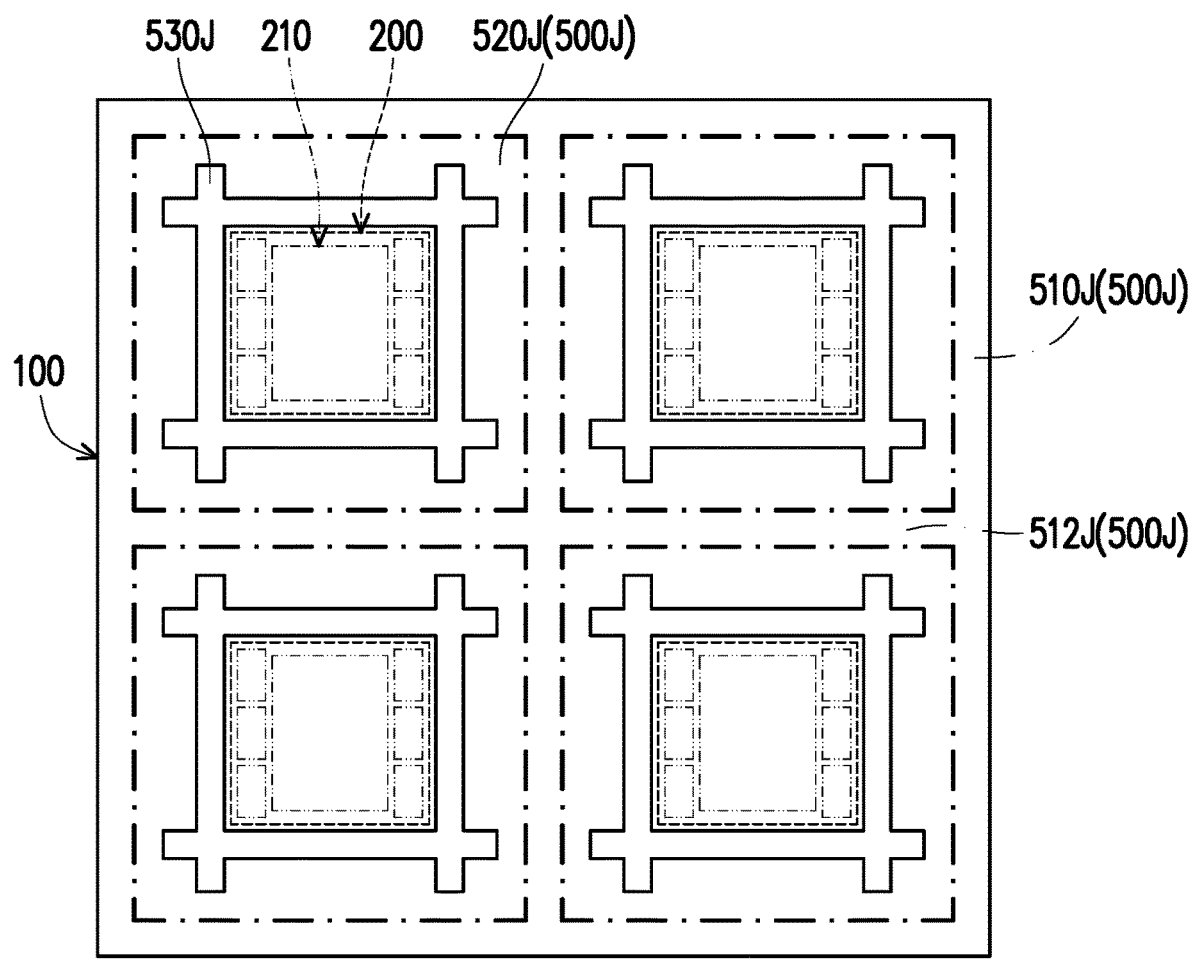
FIG. 6B and FIG. 6C are schematic top views of semiconductor devices according to some embodiments of the disclosure.
Figure 6C:
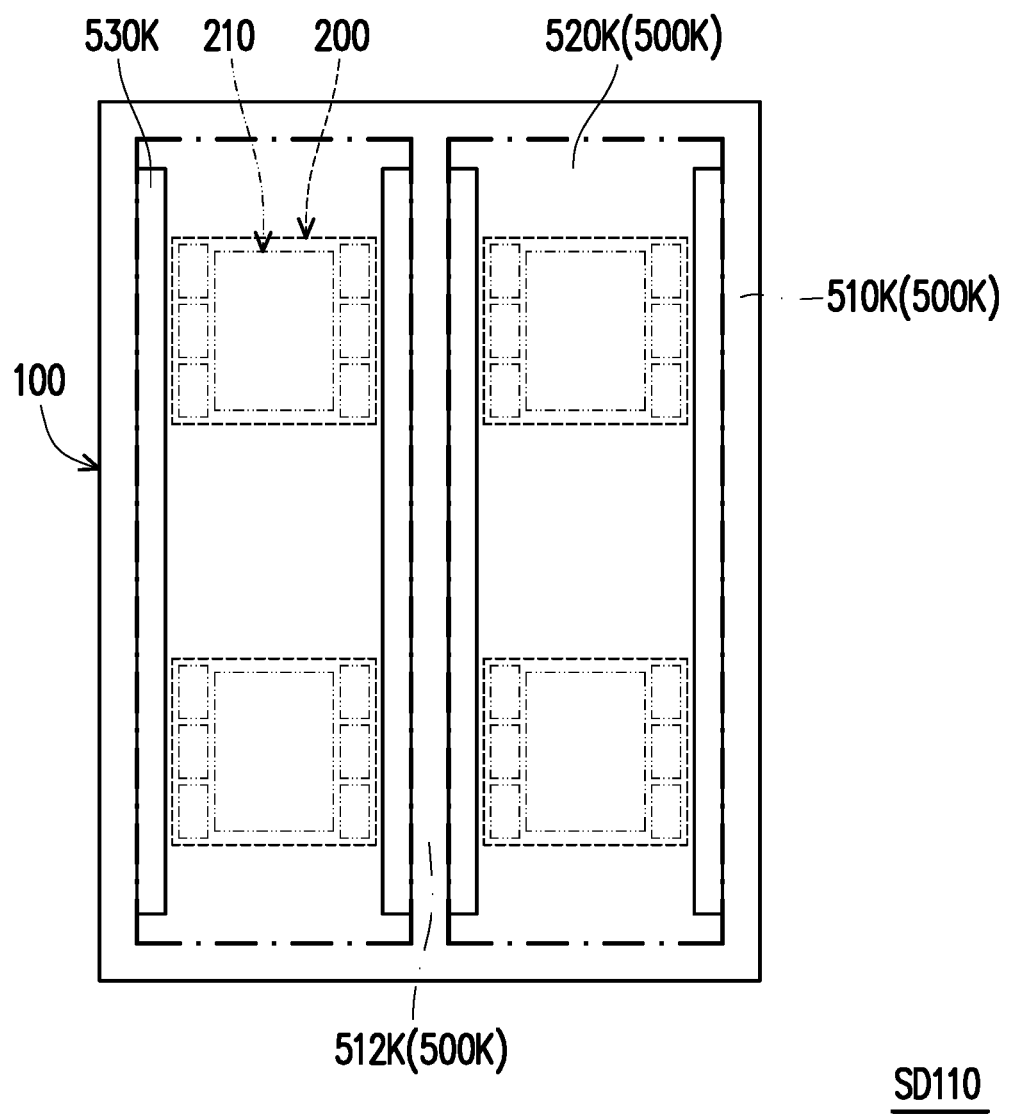

FIG. 6A is a cross-sectional view of a semiconductor device SD100 according to some embodiments of the disclosure. FIG. 6B is a schematic top view of the semiconductor device SD100 according to some embodiments of the disclosure. The semiconductor device SD100 may be similar to the semiconductor device SD10 of FIG. 1F. In the semiconductor device SD100, multiple semiconductor packages 200 may be bonded to the circuit substrate 100. The metallic cover 500J included in the semiconductor device SD100 may present multiple groups of grooves 530J, each group disposed beside one semiconductor package 200. For example, as illustrated in FIG. 6B, the semiconductor device SD100 may include four semiconductor packages 200 and the metallic cover 500J may include sixteen grooves 530J divided in four groups of four intersecting grooves 530J, each group surrounding one of the semiconductor packages 200 similarly to what described for the semiconductor device SD20 of FIG. 2C. In some embodiments, the metallic cover 500J has outer flanges 510J disposed at the edge of the semiconductor device SD100, secured by the adhesive 410 to the circuit substrate 100, and further includes inner flanges 512J disposed in between adjacent semiconductor packages 200. The Additional adhesive 450 may be disposed on the circuit substrate 100 in correspondence of the inner flanges 512J. As such, the inner flanges 512J and the outer flanges 510J are secured to the circuit substrate 100 by adhesives 450 and 410, respectively. As illustrated in FIG. 4B, in some embodiments the inner flanges 512J may extend along intersecting direction (e.g., two perpendicular directions), partitioning the space over the circuit substrate 100. However, the disclosure is not limited thereto. In FIG. 6C is illustrated a top view of a semiconductor device SD110 according to some alternative embodiments of the disclosure. The semiconductor device SD110 may be similar to the semiconductor device SD100 of FIG. 6B. In the semiconductor device SD110, there are still four semiconductor packages 200 disposed on the circuit substrate 100, while the metallic cover 500K has only four grooves 530K, running parallel with respect of each other. Each groove 530K extends along two semiconductor packages 200 aligned with respect to the extending direction of the grooves 530K, so that a pair of grooves 530K is formed on opposite sides of two semiconductor packages 200. The inner flange 512K runs in between the inner grooves 530K, along the same extending direction of the grooves 530K. The disclosure is not limited by the number of grooves 530K or of inner flanges 512K.

Figure 7A:
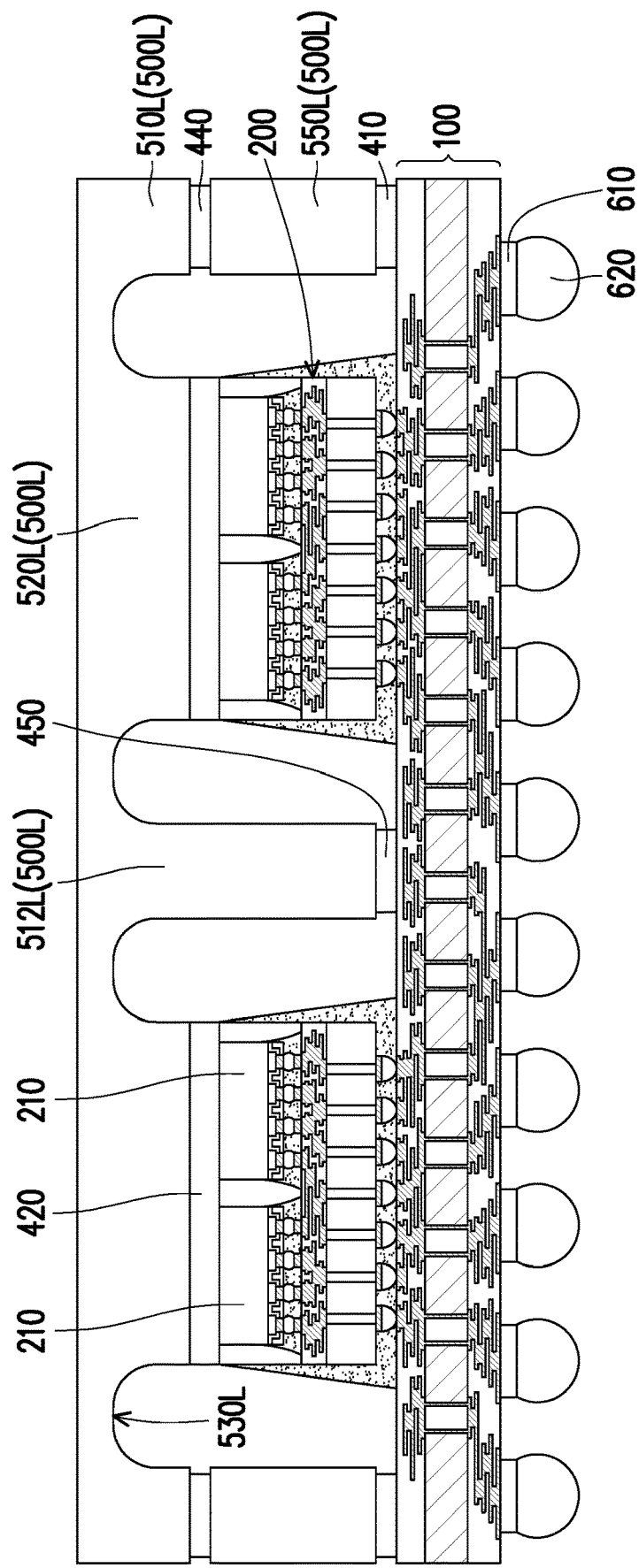
FIG. 7A is a schematic cross-sectional view of a semiconductor device according to some embodiments of the disclosure.
Figure 7B:
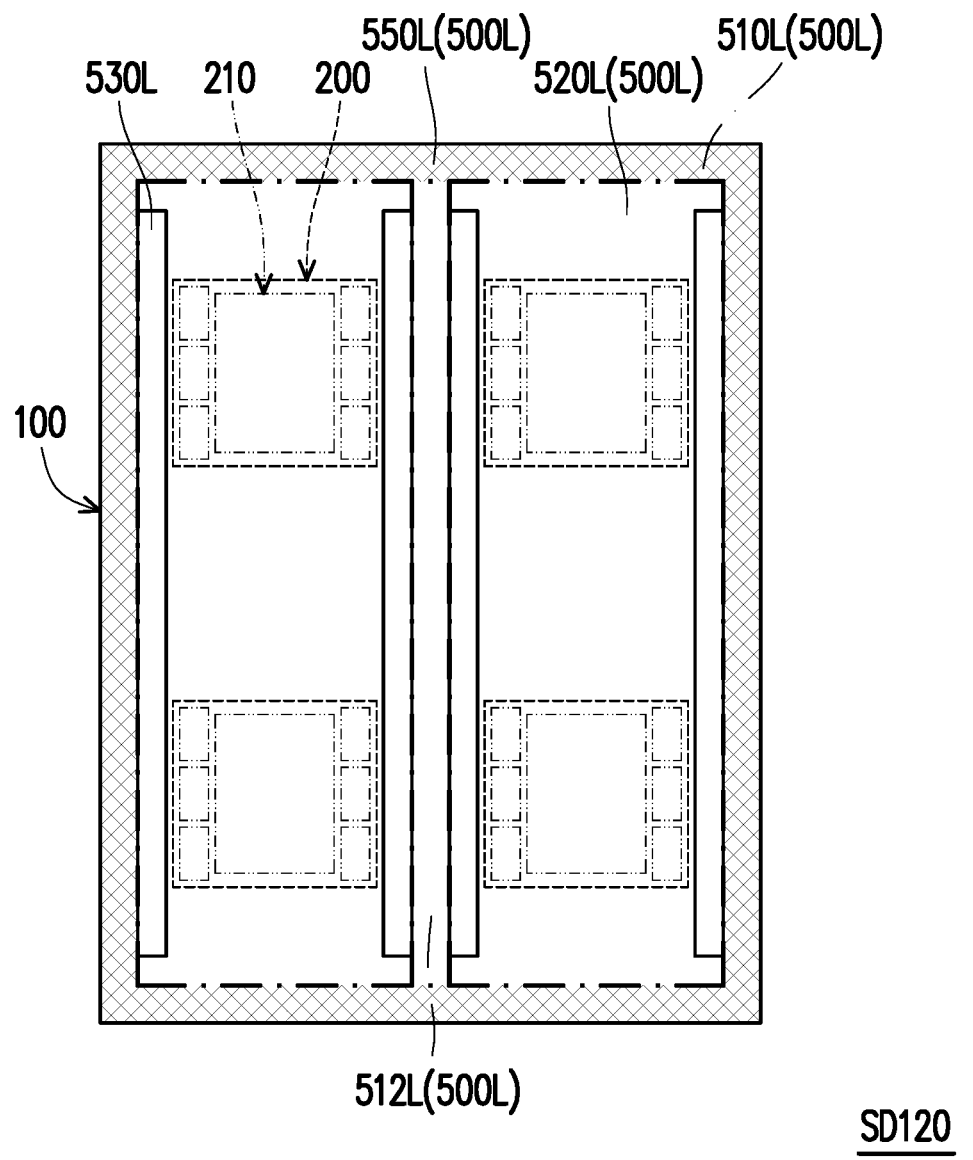
FIG. 7B is a schematic top view of a semiconductor device according to some embodiments of the disclosure.

FIG. 7A is a schematic cross-sectional view of a semiconductor device SD120 according to some embodiments of the disclosure. FIG. 7B is a schematic top view of the semiconductor device SD120 according to some embodiments of the disclosure. The semiconductor device SD120 may be similar to the semiconductor device SD100 of FIG. 6A. The semiconductor device SD120, includes the metallic cover 500L having peripheral outer flanges 510L shorter than the inner flanges 512L. The peripheral outer flanges 510L may lend on the support 550L, and be secured to the support 550L via the adhesive 440. The inner flanges 512L may be secured directly to the circuit substrate 100 by the adhesive 412. While in the top view of FIG. 7B four semiconductor packages 200 are disposed on the circuit substrate 100, and the metallic cover 500K includes four grooves 530K and one inner flange 512K, the disclosure is not limited by the number of semiconductor packages 200, the number of grooves 530K or the number of inner flanges 512K.

Figure 8A:
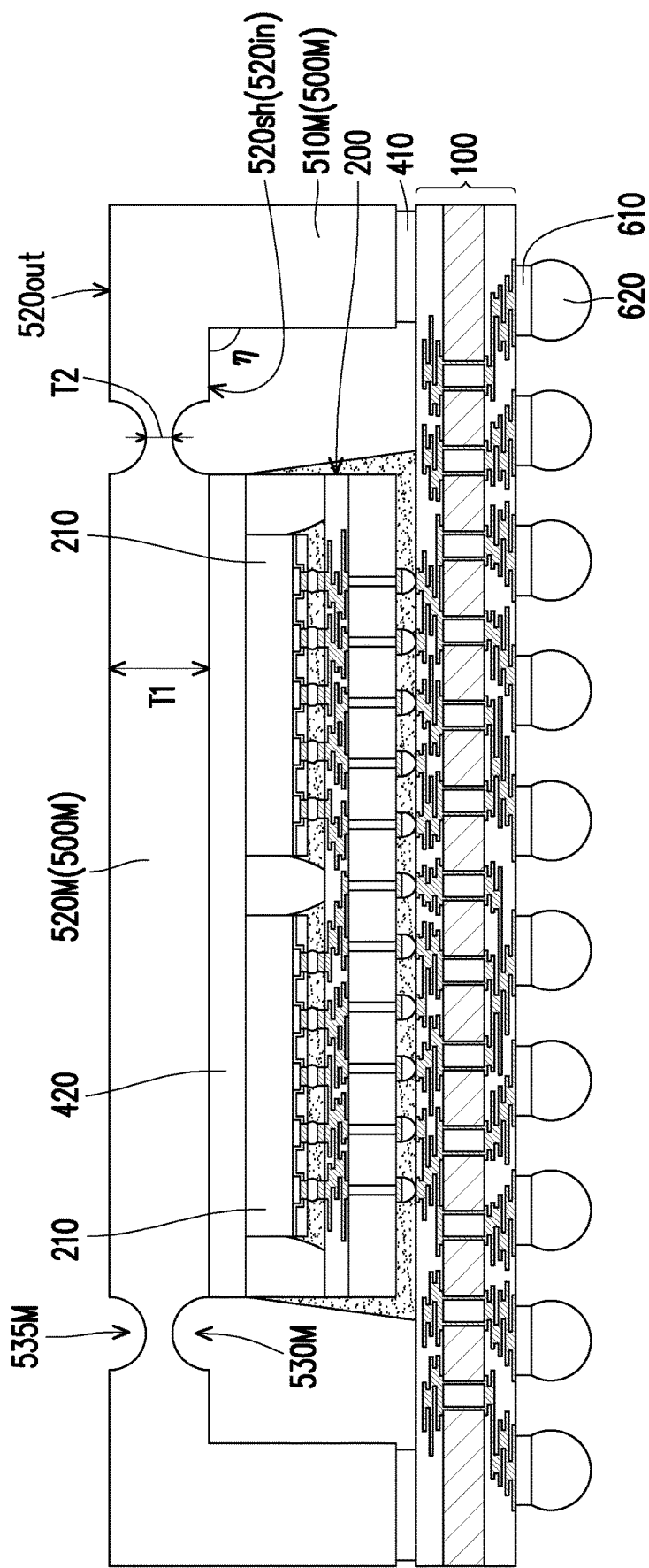
FIG. 8A is a schematic cross-sectional view of a semiconductor device according to some embodiments of the disclosure.
Figure 8B:
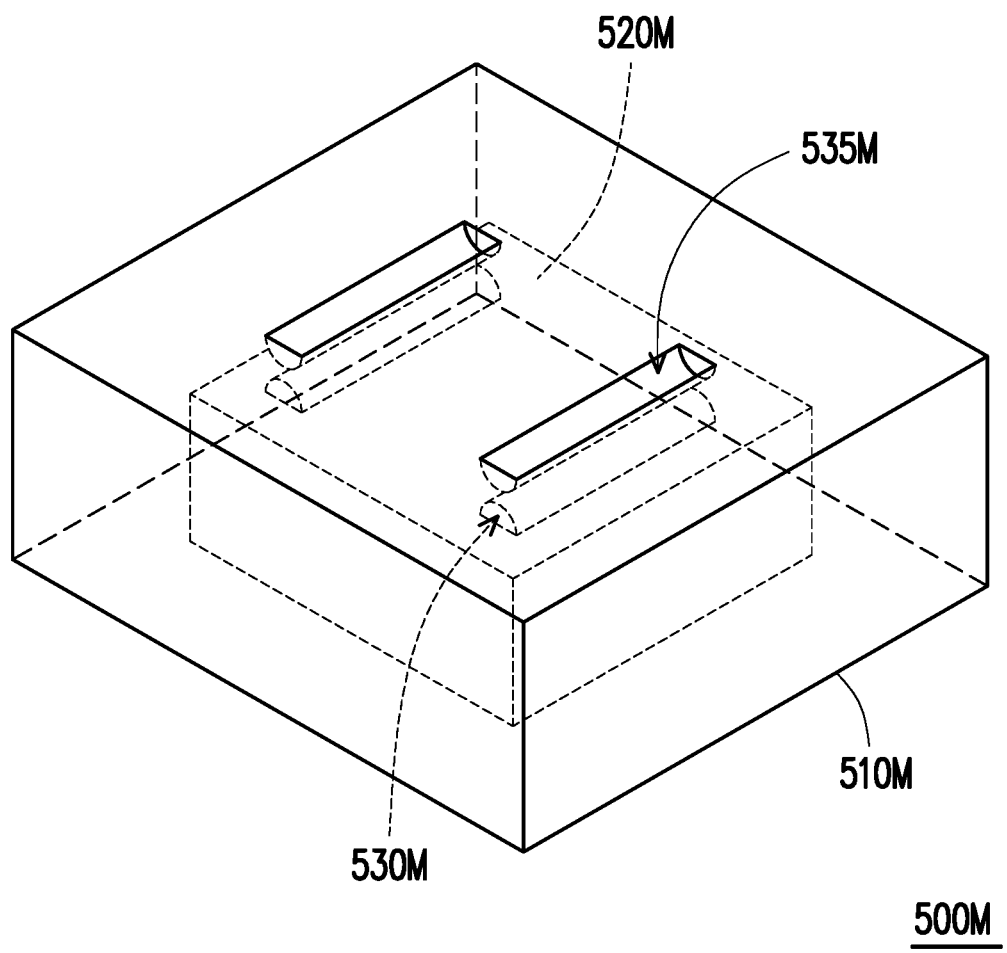
FIG. 8B is a schematic perspective view of a cover according to some embodiments of the present disclosure.

FIG. 8A is a schematic cross-sectional view of a semiconductor device SD130 according to some embodiments of the disclosure. FIG. 8B is a schematic perspective view of the metallic cover 500M included in the semiconductor device SD130 according to some embodiments of the disclosure. The semiconductor device SD130 may be similar to the semiconductor device SD10 of FIG. 1F. Referring to FIGS. 8A and 8B, in some embodiments, the metallic cover 500M presents grooves 530M on the inner surface 520in of the lid 520 (opening in the enclosure defined by the metallic cover 500M and the circuit substrate 100), and grooves 535M formed on the outer surface 520out of the lid 520M (opposite to the inner surface 520in). The grooves 530M may be disposed at the sides of the semiconductor package, according to any one of the configurations previously discussed. The outer grooves 535M may be vertically aligned with the grooves 530M. In some embodiments, the lid 520M has a thickness T1 in the region extending over the semiconductor package 200 on the TIM 420, thins out to a thickness T2 in between the grooves 530M, 535M, and thickens back to the thickness T1 after the grooves 530M, 535M before joining the outer flanges 510M. In some embodiments, the joint of the lid 520M and the outer flanges 510M may define a right angle η. That is, the inner surface 520in may present a horizontal section 520sh between the groove 530M and the outer flanges 510M, similarly to what described for the metallic cover 500B with reference to FIG. 3B.

Figure 9:
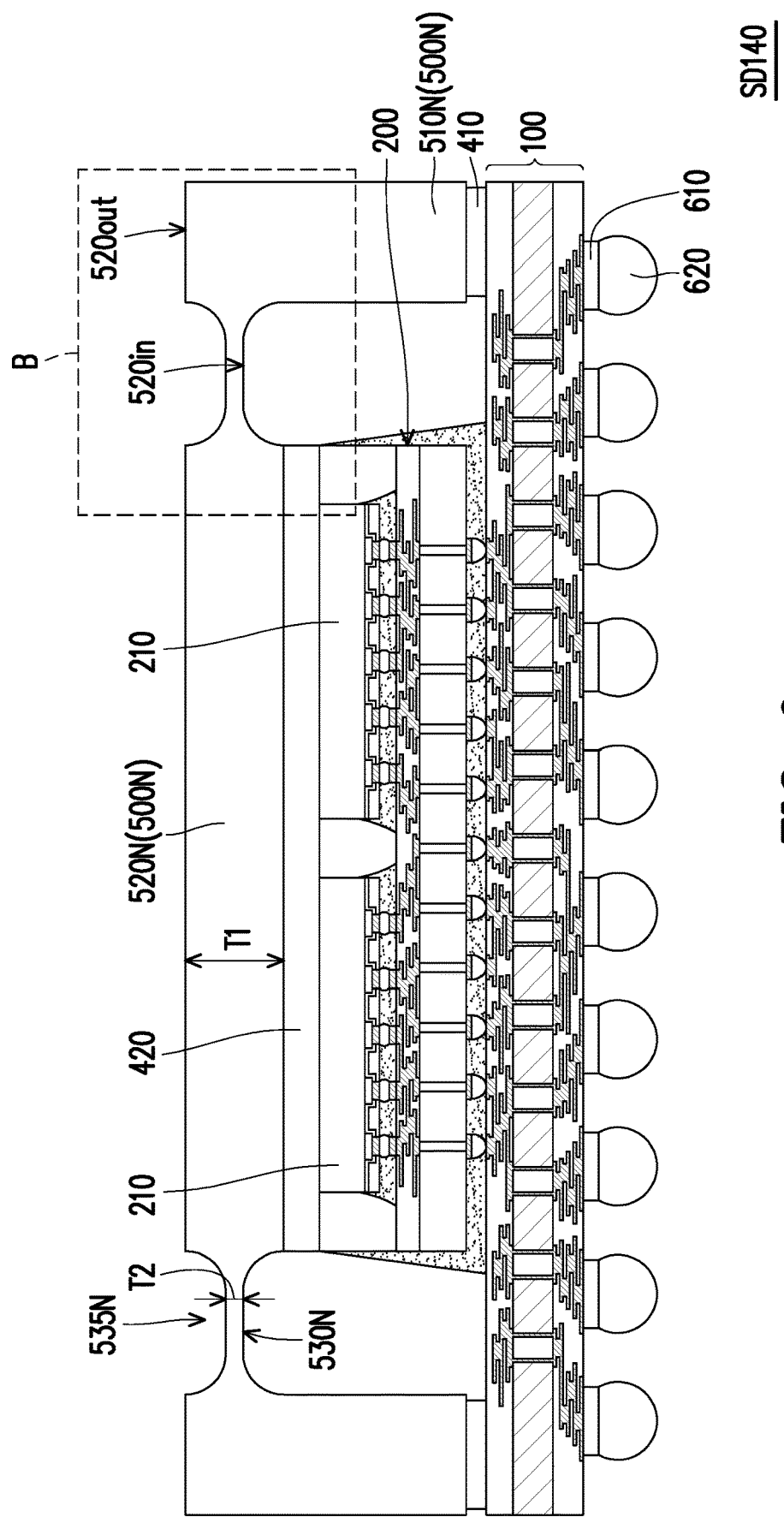
FIG. 9 is a schematic cross-sectional view of a semiconductor device according to some embodiments of the disclosure.

FIG. 9 is a schematic cross-sectional view of a semiconductor device SD 140 according to some embodiments of the disclosure. The semiconductor device SD140 may be similar to the semiconductor device SD10 of FIG. 1F. In some embodiments, the semiconductor device SD140 includes the circuit substrate 100, the semiconductor package 200 disposed on the circuit substrate 100, and the metallic cover 500N disposed on the circuit substrate 100 and enclosing the semiconductor package 200. The metallic cover 500N may present grooves 530N formed in the inner surface 520in and grooves 535N formed in the outer surface 520out, similarly to the metallic cover 500M. However, the grooves 530N, 535N of the metallic cover 500N may reach all the way to the outer flanges 510N. That is, the lid 520N may present a portion of thickness T1 over the semiconductor package 200 on the TIM 420, thin out to a thickness T2 in correspondence of the grooves 530N, 535N, and then thicken until merging into the outer flanges 510N, similarly to what previously described for the metallic cover 500A with reference to FIG. 3A.

Figure 10:
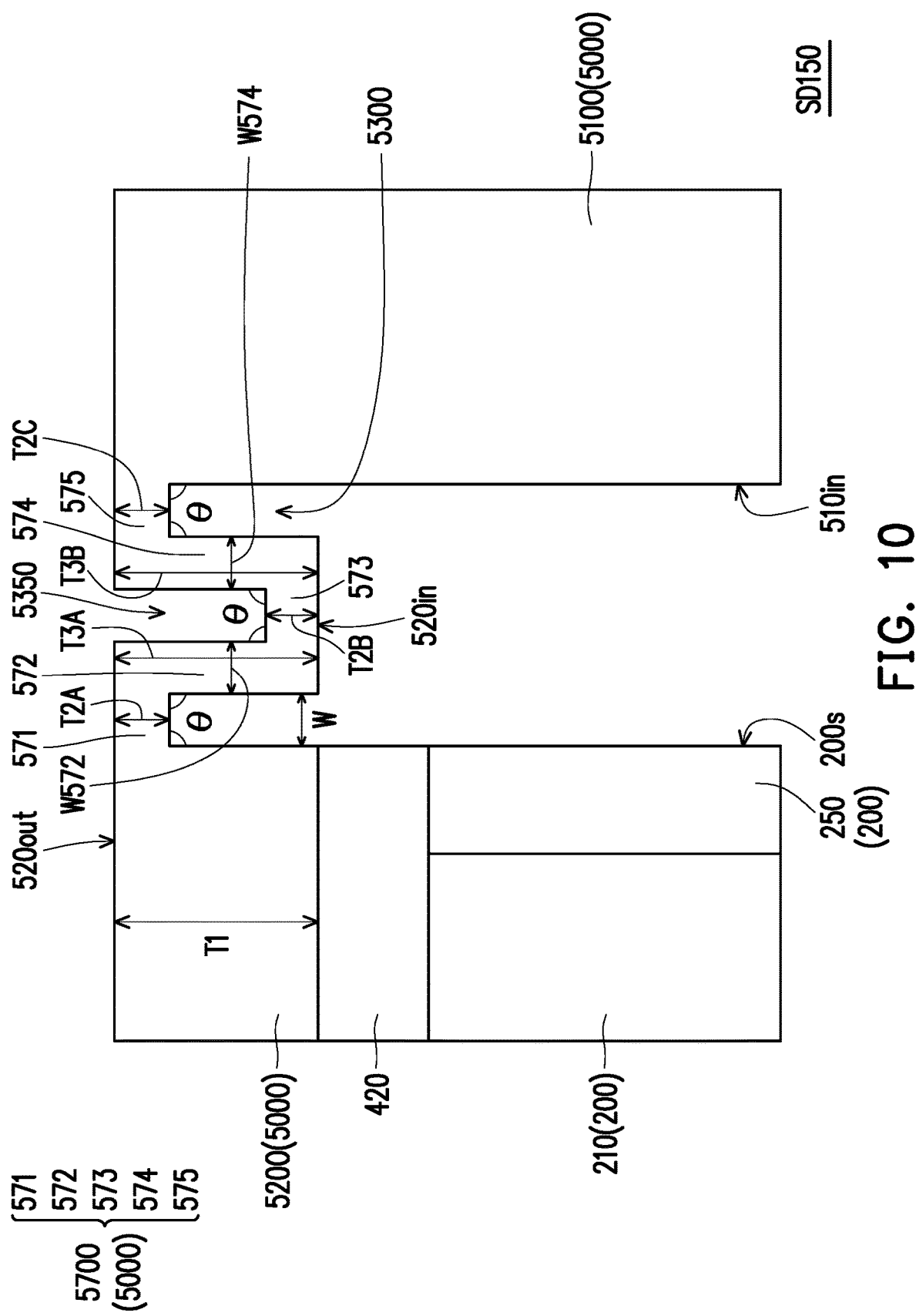
FIG. 10 is a schematic cross-sectional view of a portion of a semiconductor device according to some embodiments of the present disclosure.

FIG. 10 is a schematic cross-sectional view of a portion of a semiconductor device SD150 according to some embodiments of the disclosure. The semiconductor device SD150 may be similar to the semiconductor device SD140 of FIG. 9. In some embodiments, the view of FIG. 10 corresponds to the area B indicated in FIG. 9. In some embodiments, the semiconductor device SD150 includes the metallic cover 500O disposed over and around the semiconductor package 200. In the metallic cover 500O, grooves 530O opening in the inner surface 520in of the lid 520O are alternately formed with grooves 535O opening in the outer surface 520out of the lid 520O in between the semiconductor package 200 and the outer flanges 510O. For example, as illustrated in FIG. 10, a groove 530O is formed in the inner surface 520in adjacent to the semiconductor package 200, followed by a groove 535O in the outer surface 520out and then another groove 530O in the inner surface 520in before joining with the outer flanges 510O. In some embodiments, the alternating grooves 530O, 535O result in the lid 520O including a serpentine strip 570O in the region spanning from the semiconductor package 200 to the outer flanges 510O. The serpentine strip 570O may include a horizontal section 571 of thickness T2A attached to the region of the lid 520O of thickness T1. The thickness T2A may correspond to the deepest point of the groove 530O closer to the semiconductor package. The horizontal section 571 may be followed by a vertical section 572 of thickness T3 greater than the thickness T2A, followed by a horizontal section 573 of thickness T2B, a vertical section 574 of thickness T3B, and a horizontal section 575 of thickness T2C which joints with the outer flanges 510O. In some embodiments, the horizontal sections 571, 573, 575 corresponds to the regions where the grooves 530O, 535O are formed. The thicknesses T2A, T2B, T2C of the horizontal sections 571, 573, 575) may be equal with each other, and also equal to the widths W572, W574 of the vertical sections 572, 574. That is, the serpentine strip 570O would have a constant thickness if straightened. However, the disclosure is not limited thereto. In some alternative embodiments, the thicknesses T2A, T2B, T2C, and the widths W572, W574 may independently vary and differ from each other. Similarly, the width W of different grooves 530O, 535O may be the same, however, the disclosure is not limited thereto. In some alternative embodiments, the grooves 530O, 535O may have different widths W. In some embodiments, the horizontal sections 571, 573, 575 and the vertical sections 572, 574 are jointed with each other forming right angles θ. That is, the grooves 530O, 535O may have a rectangular section. However, the disclosure is not limited thereto. In some alternative embodiments, the thickness of the serpentine strip 570O may smoothly vary between the different sections 571-575, resulting in grooves having different sections. For example, the grooves may have a curved profile at the bottom. In some alternative embodiments, the serpentine groove 570O may include curved sections (not shown) in place of the horizontal sections 571, 573, 575.

In accordance with some embodiments of the disclosure, a semiconductor device is provided. The semiconductor device includes a circuit substrate, a semiconductor package, and a metallic cover. The semiconductor package is disposed on the circuit substrate. The metallic cover is disposed over the semiconductor package and over the circuit substrate. The metallic cover comprises a lid and outer flanges. The lid overlies the semiconductor package. The outer flanges are disposed at edges of the lid, are connected with the lid, extend from the lid towards the circuit substrate, and face side surfaces of the semiconductor package. The lid has a first region that is located over the semiconductor package and is thicker than a second region that is located outside a footprint of the semiconductor package.

In accordance with some embodiments of the disclosure, a semiconductor device comprises a circuit substrate, a first semiconductor package and a metallic cover. The first semiconductor package is disposed on the circuit substrate. The metallic cover is disposed over the circuit substrate and covers the first semiconductor package. The metallic cover comprises a lid and outer flanges. The lid extends over the first semiconductor package and the circuit substrate. The outer flanges are connected with the lid and overlie a periphery of the circuit substrate. The lid has grooves formed in a region directly facing the circuit substrate, and the grooves extend along side surfaces of the first semiconductor package.

In accordance with some embodiments of the disclosure, a manufacturing method of an electronic device is provided. The manufacturing method includes the following steps. A semiconductor package is connected to a circuit substrate. A first adhesive is disposed along edges of the circuit substrate. A metallic cover is arranged over the circuit substrate. The metallic cover has a lid with grooves and is arranged to have the lid overlying the semiconductor package and the grooves of the lid falling beside the semiconductor package along side surfaces of the semiconductor package. The metallic cover is bonded to the circuit substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a circuit substrate,
   a semiconductor package disposed on the circuit substrate, and
   a metallic cover, disposed over the semiconductor package and over the circuit substrate, the metallic cover comprising:
      a lid overlying the semiconductor package; and
      outer flanges, disposed at edges of the lid, connected with the lid, extending from the lid towards the circuit substrate, and facing side surfaces of the semiconductor package,
   wherein the semiconductor device further comprises:
      a support disposed between the outer flanges and the circuit substrate,
      a first adhesive bonding the support to the circuit substrate, and
      a second adhesive disposed on an opposite side of the support with respect to the first adhesive and bonding the support to the outer flanges,
   wherein a first region of the lid that is located over the semiconductor package is thicker than a second region of the lid that is located outside a footprint of the semiconductor package, and an elastic modulus of the first adhesive is greater than an elastic modulus of the second adhesive.

2. The semiconductor device of claim 1, further comprising a thermal interface material disposed between the lid and the semiconductor package and contacting the first region of the lid.

3. The semiconductor device of claim 1, wherein a thickness of the lid gradually becomes smaller from the first region to the second region.

4. The semiconductor device of claim 1, wherein an outer surface of the lid is substantially flat.

5. The semiconductor device of claim 4, wherein an inner surface of the lid opposite to the outer surface includes a section oblique with respect to the outer surface.

6. A semiconductor device, comprising:
   a circuit substrate;
   a first semiconductor package disposed on the circuit substrate; and
   a metallic cover disposed over the circuit substrate and covering the first semiconductor package, the metallic cover comprising:
      a lid, horizontally extending over the first semiconductor package and the circuit substrate; and
      outer flanges, connected with the lid, vertically extending from the lid towards the circuit substrate, and overlying a periphery of the circuit substrate,
   wherein the lid has grooves formed therein, in a region directly facing the circuit substrate, and the grooves extend along side surfaces of the first semiconductor package and are configured to allow for at least some relative motion between the lid and the outer flanges,
   wherein a first groove of the grooves extends along a first direction, a second groove of the grooves extends along a second direction different than the first direction, and the first groove and the second groove intersect to extend across and beyond each other.

7. The semiconductor device of claim 6, wherein the first groove and a third groove of the grooves extend along a pair of opposite side surfaces of the side surfaces.

8. The semiconductor device of claim 7, wherein the second groove intersects the first groove and the third groove.

9. The semiconductor device of claim 6, further comprising a second semiconductor package disposed on the circuit substrate beside the first semiconductor package, wherein a third groove and a fourth groove of the grooves extend parallel to the first groove, along a pair of opposite side surfaces of the second semiconductor package.

10. The semiconductor device of claim 9, further comprising an inner flange extending from the lid toward the circuit substrate and separating the first groove from the third groove.

11. The semiconductor device of claim 10, wherein the inner flange extends further close to the circuit substrate than the outer flanges.

12. The semiconductor device of claim 6, wherein the first groove is formed on an inner surface of the lid, and a third groove is formed on an outer surface of the lid and is vertically aligned with the first groove.

13. A manufacturing method of a semiconductor device, comprising:
    connecting a semiconductor package to a circuit substrate, whereby the semiconductor package is disposed on the circuit substrate;
    disposing a first adhesive along edges of the circuit substrate;
    arranging a metallic cover over the semiconductor package and the circuit substrate, wherein the metallic cover comprises a lid and outer flanges disposed at edges of the lid and connected with the lid, wherein the metallic cover is arranged to have the lid overlying the semiconductor package and the outer flanges extending from the lid towards the circuit substrate, facing side surfaces of the semiconductor package; and
    bonding the metallic cover to the circuit substrate,
    wherein a first region of the lid that is located over the semiconductor package is thicker than a second region of the lid that is located outside a footprint of the semiconductor package, and
    wherein bonding the metallic cover to the circuit substrate comprises:
    bonding a support on the first adhesive; and
    bonding the outer flanges to the support via a second adhesive, wherein an elastic modulus of the first adhesive is greater than an elastic modulus of the second adhesive.

14. The manufacturing method of claim 13, wherein the second region of the lid is configured to allow for at least some relative motion between the first region of the lid and the outer flanges.

15. The manufacturing method of claim 13, wherein bonding the metallic cover to the circuit substrate further comprises bonding the lid to the outer flanges via a third adhesive.

16. The manufacturing method of claim 14, wherein
    multiple semiconductor packages are connected to the circuit substrate,
    the metallic cover further includes an inner flange disposed in between a pair of adjacent semiconductor packages, and
    the method further comprises:
    disposing a third adhesive in between the pair of adjacent semiconductor packages; and
    bonding the inner flange to the circuit substrate via the third adhesive, so that the second region extends on a side of a first semiconductor package of the pair of adjacent semiconductor packages on one side of the inner flanges, and a third region of the lid thinner than the first region of the lid extends on a side of a second semiconductor package of the pair of adjacent semiconductor packages at an opposite side of the inner flanges with respect to the second region.

17. The manufacturing method of claim 13, further comprising disposing a thermal interface material on the semiconductor package before bonding the metallic cover.

18. The manufacturing method of claim 13, wherein the second region extends up to the outer flanges of the lid.

19. The semiconductor device of claim 6, wherein the grooves are formed as concavities into the lid.

* * * * *